(12) United States Patent
Banna et al.

(10) Patent No.: US 10,037,981 B2
(45) Date of Patent: Jul. 31, 2018

(54) INTEGRATED DISPLAY SYSTEM WITH MULTI-COLOR LIGHT EMITTING DIODES (LEDS)

(71) Applicant: GLOBALFOUNDRIES Inc., Grand Cayman (KY)

(72) Inventors: Srinivasa Banna, San Jose, CA (US); Sanjay Jha, San Diego, CA (US); Deepak Nayak, Union City, CA (US); Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/599,465

(22) Filed: May 18, 2017

(65) Prior Publication Data
US 2017/0358562 A1    Dec. 14, 2017

Related U.S. Application Data

(60) Provisional application No. 62/337,898, filed on May 18, 2016.

(51) Int. Cl.
*H01L 33/00* (2010.01)
*H01L 25/16* (2006.01)
(Continued)

(52) U.S. Cl.
CPC .......... *H01L 25/167* (2013.01); *H01L 23/481* (2013.01); *H01L 24/08* (2013.01); *H01L 25/50* (2013.01); *H01L 21/8258* (2013.01); *H01L 25/0753* (2013.01); *H01L 27/0688* (2013.01); *H01L 27/092* (2013.01); *H01L 27/156* (2013.01); *H01L 33/06* (2013.01); *H01L 33/24* (2013.01); *H01L 33/32* (2013.01); *H01L 2224/08146* (2013.01)

(58) Field of Classification Search
None
See application file for complete search history.

(56) References Cited

U.S. PATENT DOCUMENTS 6,627,552 B1    9/2003    Nishio et al.
7,582,498 B2    9/2009    D'Evelyn et al.
(Continued)

OTHER PUBLICATIONS

Furukawa,Yuzo,Hiroo Yonezu, and Akihiro Wakahara. "Monolithic integration of light-emitting devices and silicon transistors." SPIE, Newsroom, Nov. 19, 2007, DOI:10.1117/2.1200711.0914,Toyohashi, Japan.
(Continued)

*Primary Examiner* — Bradley K Smith
(74) *Attorney, Agent, or Firm* — Horizon IP PTE LTD.

(57) ABSTRACT

A display system is disclosed. The display system comprises a light emitting diode (LED) device and a backplane (BP) device. The LED device comprises a plurality of LEDs having LED terminals. An LED bonding surface comprising a dielectric layer with LED bonding surface contact pads is coupled to diode terminals of the LEDs. The backplane (BP) device comprises a BP substrate having top and bottom surfaces. A plurality of system on chip (SoC) chips are bonded to chip pads disposed on a bottom surface of the BP device. The SoC chips are electrically coupled to the CMOS components of the BP device and LEDs of the LED device.

20 Claims, 19 Drawing Sheets

(51) Int. Cl.
*H01L 23/48* (2006.01)
*H01L 25/00* (2006.01)
*H01L 23/00* (2006.01)
*H01L 25/075* (2006.01)
*H01L 27/15* (2006.01)
*H01L 33/32* (2010.01)
*H01L 33/06* (2010.01)
*H01L 33/24* (2010.01)
*H01L 27/092* (2006.01)
*H01L 21/8258* (2006.01)
*H01L 27/06* (2006.01)

(56) References Cited

U.S. PATENT DOCUMENTS

| | | | |
|---|---|---|---|
| 8,163,581 B1 | 4/2012 | Or-Bach et al. | |
| 8,241,932 B1 | 8/2012 | Yu et al. | |
| 9,941,329 B2 * | 4/2018 | Nayak | H01L 27/156 |
| 2006/0038188 A1 | 2/2006 | Erchak et al. | |
| 2006/0049415 A1 | 3/2006 | Liao et al. | |
| 2009/0140274 A1 | 6/2009 | Wierer, Jr. et al. | |
| 2010/0006873 A1 | 1/2010 | Raring et al. | |
| 2010/0081218 A1 | 4/2010 | Hardin | |
| 2012/0025232 A1 | 2/2012 | Gwo et al. | |
| 2014/0191249 A1 | 7/2014 | Blanchard et al. | |
| 2014/0206117 A1 | 7/2014 | Sonoda et al. | |
| 2014/0368772 A1 | 12/2014 | Hwang et al. | |
| 2014/0374742 A1 | 12/2014 | Tsang | |
| 2015/0295013 A1 | 10/2015 | Matsumoto et al. | |
| 2016/0093665 A1 | 3/2016 | Schubert et al. | |
| 2016/0095221 A1 * | 3/2016 | Ramachandran | H05K 1/115 361/783 |
| 2016/0164033 A1 | 6/2016 | Moon et al. | |
| 2017/0148756 A1 * | 5/2017 | Yu | H01L 24/32 |

OTHER PUBLICATIONS

Vincent Lee, High Brightness Microdisplays by Monolithic Integration of III-V LEDs and Thin Film Silicon Transistors (slides), International Display Workshop, Dec. 4, 2014, Slides 7 &15, Niigata, Japan.

J. W. Chung, K. Ryu, B. Lu and T. Palacios, "GaN-on-Si technology, a new approach for advanced devices in energy and communications," 2010 Proceedings of the European Solid State Device Research Conference, Sevilla, 2010, pp. 52-56, Massachusetts Institute of Technology, Cambridge, USA.

T. Mak, Z. Liu, W. Chong, Y. Gao, X. Fang, J. Sin, P. Mok, and K. Lau, "Integration Scheme toward LED System-on-a-Chip (SoC)," in Light, Energy and the Environment, OSA Technical Digest (online) (Optical Society of America, 2014), paper DTu3D.4.

Dong, Wang, Huang, Zhang, Guan and Chen, "A 630dpi dynamic LED display array in standard Si-based CMOS technology.",Received Mar. 10, 2011; accepted Sep. 20, 2011; published online Apr. 12, 2012, State Key Laboratory of Integrated Optoelectronics, Institute of Semiconductors, Chinese Academy of Science, Beijing 10083 China.

M. Volpert et al., "A Wafer Level approach for led packaging using TSV last technology," 2015 IEEE 65th Electronic Components and Technology Conference (ECTC), San Diego, CA, 2015, pp. 1102-1108. doi: 10.1109/ECTC.2015.7159732 URL: http://ieeexplore.ieee.org/stamp/stamp.jsp?tp=&arnumber=7159732&isnumber=7159553.

Renjie Wang, Hieu P. T. Nguyen, Ashfiqua T. Connie, J. Lee, Ishiangs Shih, and Zetian Mi, "Color-tunable, phosphor-free InGaN nanowire light-emitting diode arrays monolithically integrated on silicon," Opt. Express 22, A1768-A1775 (2014), Optical Society of America.

* cited by examiner

INTEGRATED DISPLAY SYSTEM WITH MULTI-COLOR LIGHT EMITTING DIODES (LEDS)

CROSS-REFERENCE TO RELATED APPLICATIONS

This application claims the priority of U.S. Provisional Application No. 62/337,898, entitled "Smart display system and method of forming there of" filed on May 18, 2016. In addition, this application is concurrently filed with and cross-references to U.S. patent application Ser. No. 15/599,438 titled "LIGHT EMITTING DIODES (LEDs) WITH INTEGRATED CMOS CIRCUITS" which claims the priority of U.S. Provisional Application No. 62/337,904, entitled "Integration of semiconductor LED with Si integrated circuits and TFTs" filed on May 18, 2016; and further filed with and cross-references to U.S. patent application Ser. No. 15/599,427 titled "LIGHT EMITTING DIODES (LEDs) WITH STACKED MULTI-COLOR PIXELS FOR DISPLAYS" which claims the priority of U.S. Provisional Application No. 62/337,900, entitled "3 Color stacked RGB pixel using Fin and Nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/337,902, entitled "Vertically stacked RGB LED pixel for smart display" filed on May 18, 2016; and U.S. patent application Ser. No. 15/599,458 titled "LEDs WITH THREE COLOR RGB PIXELS FOR DISPLAYS" which claims the priority of U.S. Provisional Application No. 62/337,901, entitled "Three-Color RGB pixel using m-plane nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/355,895, entitled "3 Color RGB pixel using fin LEDs for smart displays" filed on Jun. 29, 2016. All disclosures are incorporated herewith by reference in their entireties for all purposes.

BACKGROUND

Light emitting diodes (LEDs) are widely used for various color display technologies, including televisions, smart phones and computer monitors. For portable applications, there is a need or demand for low cost, low power, high brightness and high resolution display pixel technology. Such requirement is particularly apparent for portable and small form factor displays, such as smart phones and head mount display devices which are used in virtual reality (VR) and augmented reality (AR) applications.

To form color displays, 3 primary colors are needed. The three primary colors are red, green and blue. However, conventional color displays using red, green and blue LEDs are complex, leading to high manufacturing cost. For example, conventional color displays employ different materials or components for different color LEDs, including color phosphors, color filters and down convertors. In addition, conventional displays have LEDs which are formed on a different substrate than circuit components, such as complementary metal oxide semiconductor (CMOS) circuit components. This is because the high temperature processes of forming CMOS circuit components damages the LEDs. In the case of a display system, there are numerous CMOS and heterogenous types of components on different chips. The inability to integrate conventional LED displays with CMOS and other chips of a system hinters making compact displays, such as those desired in VR and AR applications.

The present disclosure is directed to cost effective, compact and high resolution color LEI) display system.

SUMMARY

Embodiments of the present disclosure generally relate to semiconductor devices having light emitting diodes (LEDs). In one embodiment, a display system is disclosed. The display system comprises a light emitting diode (LED) device and a backplane (BP) device. The LED device comprises a plurality of LEDs having LED terminals. An LED bonding surface comprising a dielectric layer with LED bonding surface contact pads is coupled to diode terminals of the LEDs. The backplane (BP) device comprises a BP substrate having top and bottom surfaces. A plurality of system on chip (SoC) chips are bonded to chip pads disposed on a bottom surface of the BP device. The SoC chips are electrically coupled to the CMOS components of the BP device and LEDs of the LED device.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention, in the following description, various embodiments of the present invention are described with reference to the following drawings, in which.

DETAILED DESCRIPTION

Embodiments generally relate to semiconductor devices. More particularly, embodiments relate to semiconductor devices having light emitting diodes (LEDs) with multi-color pixels, such as RGB color pixels. In one embodiment, the RGB LEDs are integrated with various IC chips to form low power, high brightness and high resolution color display systems used in, for example, wearable devices and head mount display devices, such as those employed in virtual reality (VR) or augmented reality (AR) applications. The LED display system may also be used in other applications.

The fabrication of devices may involve the formation of features on a substrate that make up components, such as LEDs, transistors as well as other components. The devices are interconnected, enabling the devices to perform the desired functions. To form the features and interconnections, layers are repeatedly deposited on the substrate patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of devices, numerous reticles may be used for different patterning processes. Furthermore, a plurality of devices may be formed on the wafer in parallel.

Figure 1A:
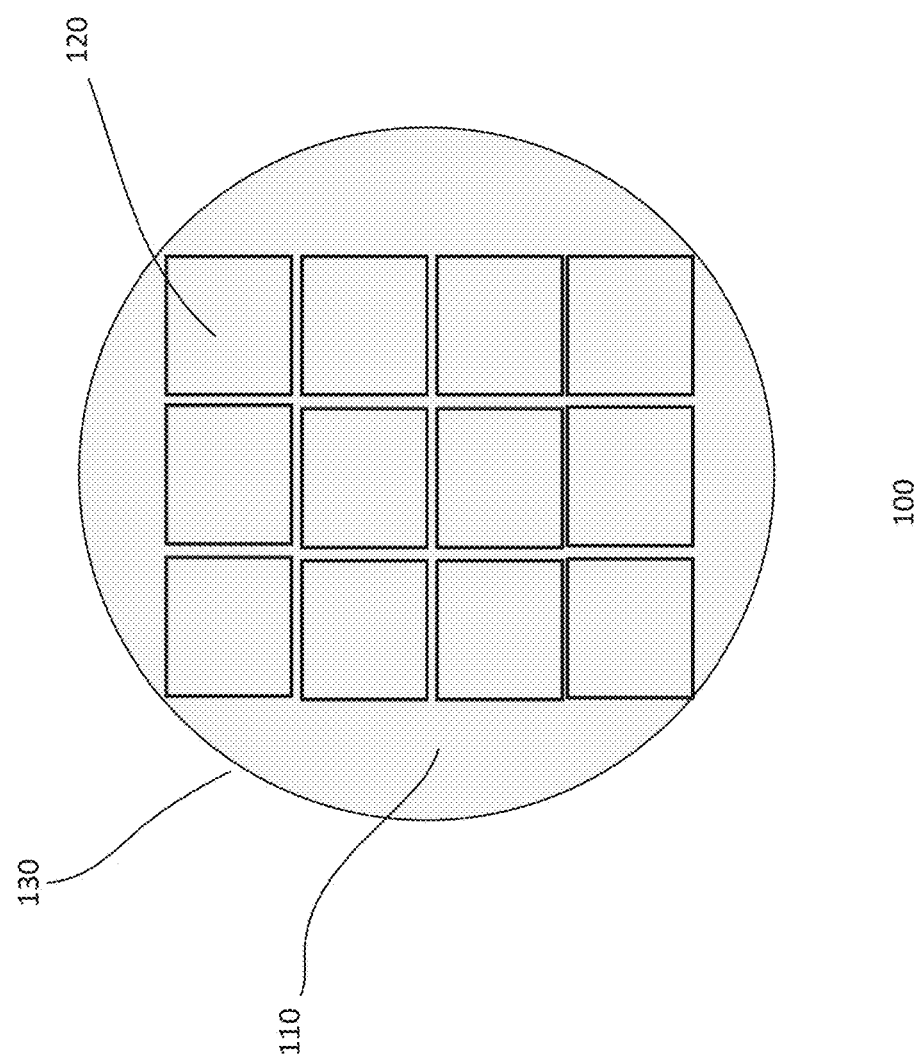
FIGS. 1A-D show various views an embodiment of a device.
Figure 1B:
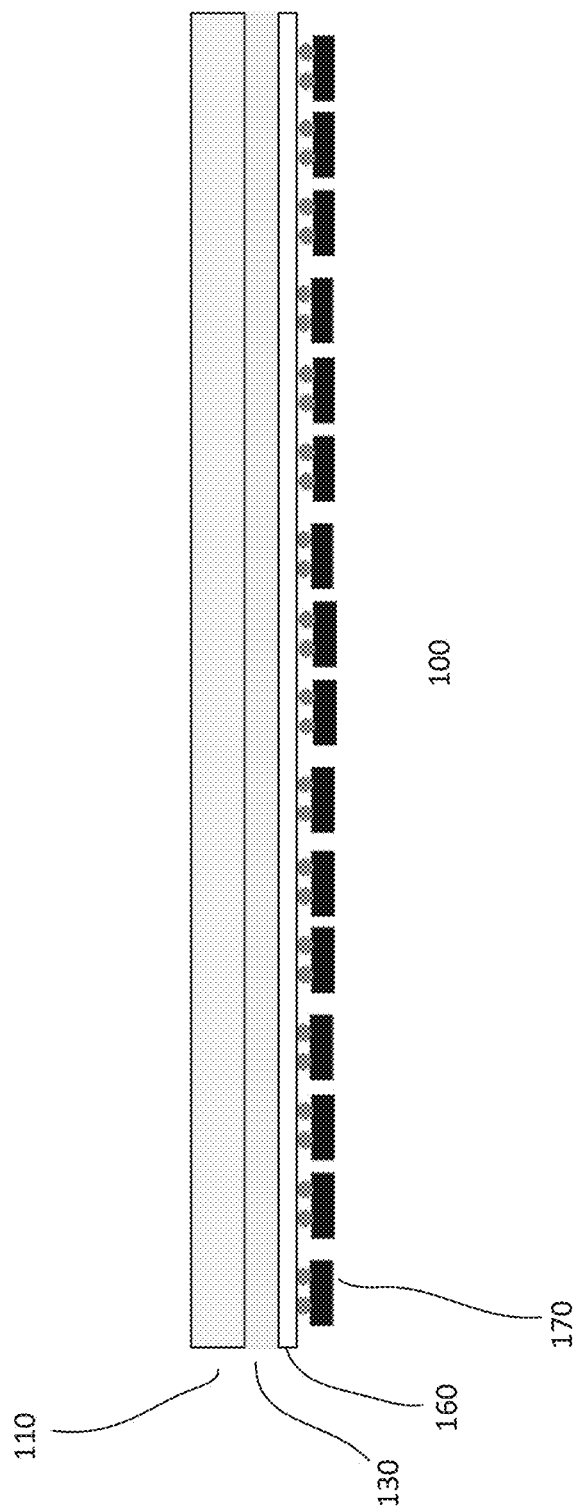
Figure 1C:
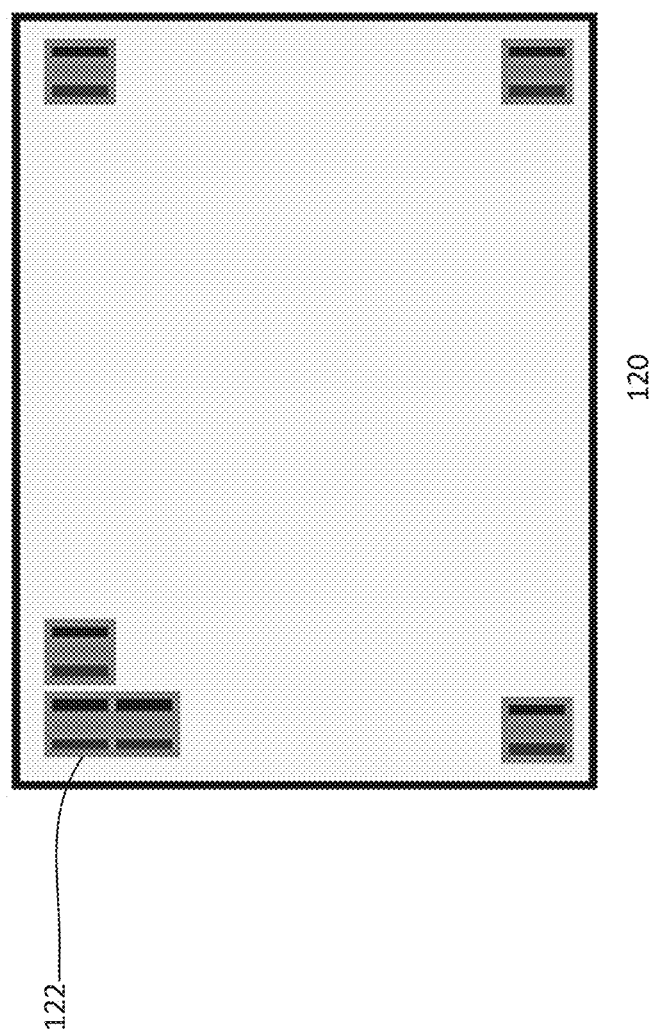
Figure 1D:
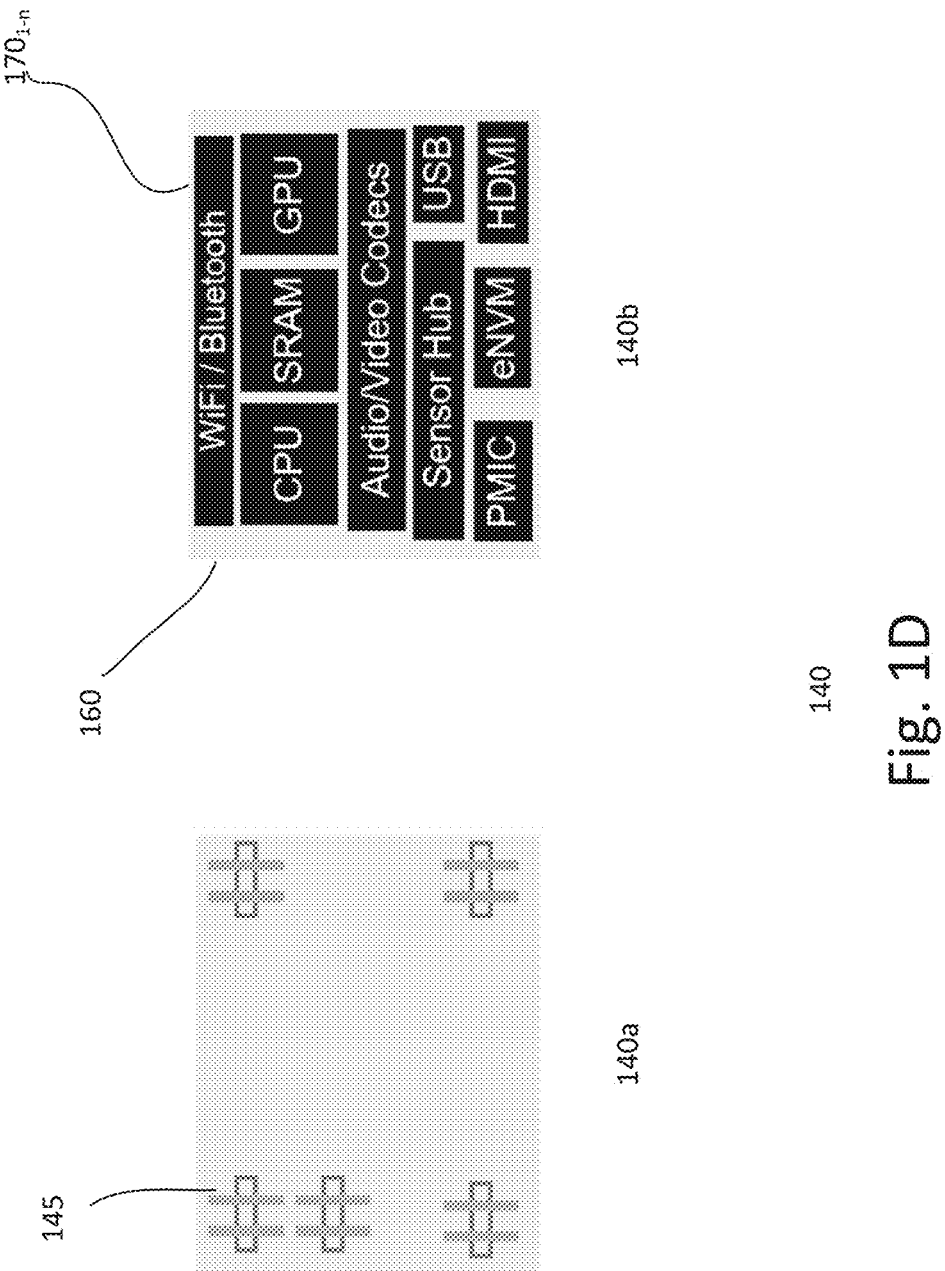

FIGS. 1A-D) show various views of different parts of a device. FIGS. 1A-B show top and cross-sectional views of devices 100 at the wafer level while FIG. 1C shows an LED device 120 and FIG. 1D shows front and backside views of a backplane device 140. Referring to FIGS. 1A-D, a wafer stack is shown. The wafer stack includes a first water 110 stacked on top of a second wafer 130. The first and second wafers include a plurality of first and second devices disposed thereon. For example, the first wafer includes a plurality of first devices and the second wafer includes a plurality of second devices. The devices of the first and second wafers, when stacked, are aligned.

In one embodiment, the first wafer is an LED wafer with a plurality of LED devices 120. The LED devices are multi-color LED devices. A multi-color device, for example, includes multi-color LED pixels 122, such as red (R), green (G) and blue (B) configured in as color display. As shown, the top surface of the wafer includes the LEDs of the LED devices. For example, the surface of the LED wafer is the display side of the wafer. Interconnections to terminals of the pixels of the LED devices are provided on the bottom surface of the first wafer. The interconnections may include through silicon via (TSV) contacts or metal pad-metal pad bonding.

As for the second wafer, it is a backplane (BP) wafer with BP devices 140. The BP device includes a top surface 140*a* and a bottom surface 140*b*. A BP device is a complementary metal oxide semiconductor (CMOS) backplane device with CMOS components, such as CMOS transistors. The BP device may include other CMOS devices. The CMOS transistors may be referred to as front-end-of-line CMOS components. The FEOL components are disposed on the top surface of the BP wafer. A backend-of-line (BEOL) dielectric is disposed on the CMOS components.

Back-end-of-line (BEOL) components are disposed over FEOL components. BEOL processing includes forming a BEOL dielectric having a plurality of interlevel dielectric (ILD) layers. An ILD layer includes a contact level with via contacts and metal level with metal lines. The BEOL dielectric provides interconnections to the CMOS components. The top surface of the BEOL dielectric 140*a* of the BP devices of the BP wafer includes interconnections 145 for the bottom surface of the LED devices of the LED wafer.

In one embodiment, interconnections to the CMOS components are provided on the bottom surface 140*b* of the BP wafer. For example, TSV contacts are provided which extends from the bottom surface of the BP wafers to the CMOS components. The TSV contacts may be interconnected to via contacts and metal lines on the BEOL dielectric.

In one embodiment, the bottom surface of the BP devices includes a redistribution layer 160. The redistribution layer provides interconnections to the TSV contacts on a BP device to IC chip or dies 170$_{1-n}$ of the display system. The RDL may include metal bumps, such as copper bumps, to facilitate bonding with die bonds on the chips to the RDL. For example, the chips may be die bonded to the RDL. The IC chips may be system on chip (SoC) chips. The SoC chips may include CPU cores, dsp cores, on-chip memories, audio/video codecs, eye/head tracking sensors (sensor hub), wireless interconnections, including blue tooth and WiFi connections, and other connections including HDMI, USB, and PMIC connections. Other types of SoC chips may also be included. The SoC chips may include heterogeneous substrates, such as silicon substrate, silicon germanium substrates and gallium arsenide substrates. Other types of substrates may also be included in the SoC chips.

As described, the BP device, which includes CMOS components, serves as an interposer for integrating SoC chips with an LED device. The interposer enables heterogeneous integration of LED chips with SoCs. The integration employs wafer bonding and die bonding using wafer level packaging, which includes RDL and TSVs. This facilitates compactness, low power consumption, low cost as well as enhanced user experience for a display system.

Figure 2:
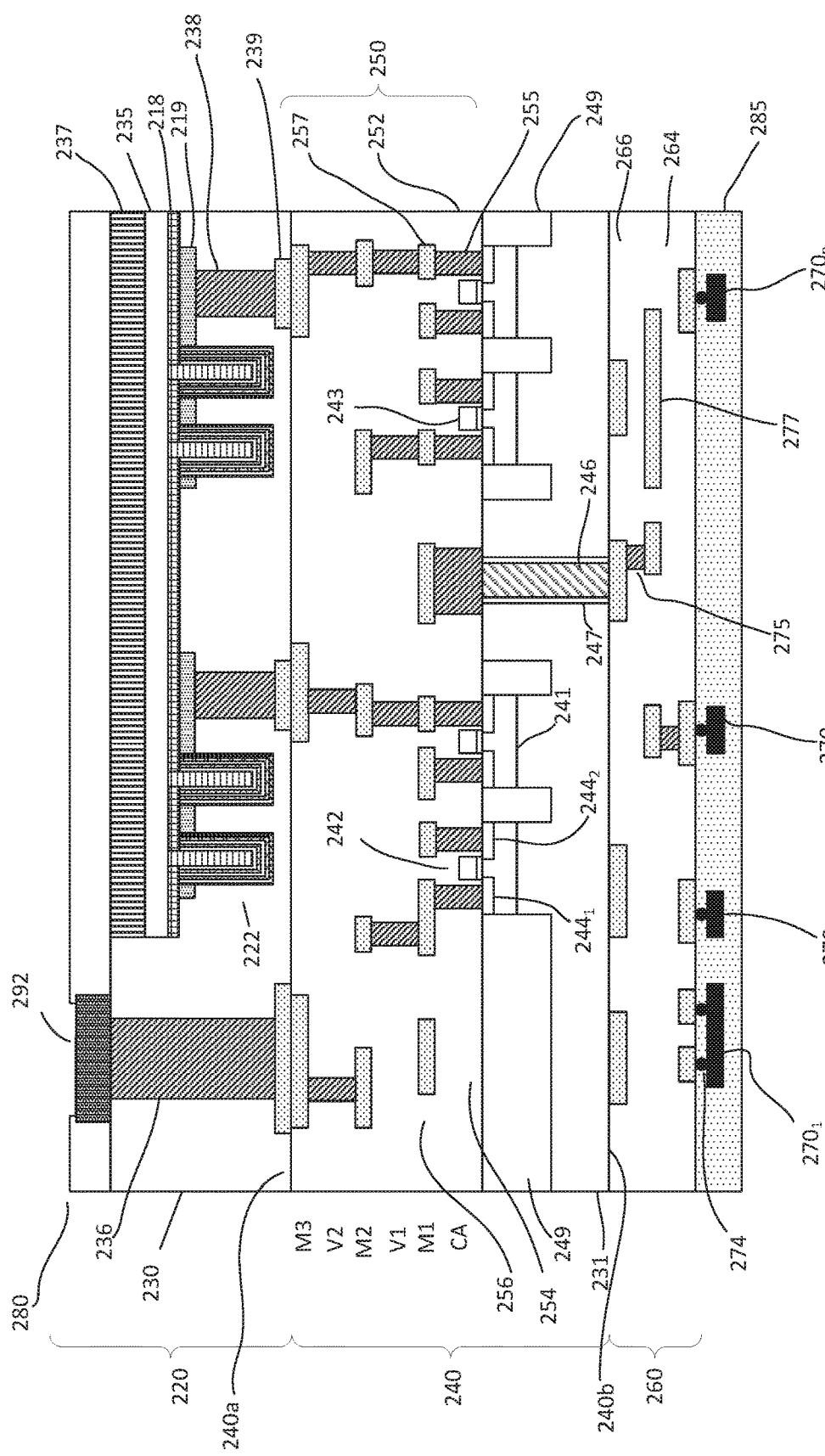
FIGS. 2-3 show simplified cross-sectional views of different embodiments of a device.

FIG. 2 shows a simplified cross-sectional view of an embodiment, of a device 200. The device includes an LED device 220 bonded to a BP device 240. In one embodiment, a top surface of the LED device is bonded to a top surface of the BP device. Disposed on a bottom surface of the BP device is a RDL 260 on which a plurality of SoC chips 270$_{1-n}$ are bonded. The device may be part of or originally part of an LED wafer with a plurality of LED devices and BP wafer with plurality of BP devices. The wafer may be diced to singulate the devices into individual devices.

In one embodiment, an LED device includes an LED substrate (not shown). The LED substrate includes first and second major surfaces. The first major surface may be referred to as the LED surface and the second major surface may be referred to as bottom surface. The first surface includes an LED region in which LEDs 222 are formed. The first surface may include other non-LED regions. In one embodiment, the LED substrate serves as a carrier substrate for handing the LED device as well as serving as a surface for forming the LEDs.

The substrate may be a bulk semiconductor substrate, such as a silicon (Si) substrate. The substrate, for example, may have a thickness of about 50-750 um. Other types of substrates, such as silicon carbide (SiC) or sapphire substrates may also be employed. Alternatively, the substrate may be a crystal-on-insulator (COI) substrate. A COI substrate includes a thin surface substrate and a bulk substrate separated by an insulator layer, such as buried oxide layer (BOX). In the case of a COI substrate, the bulk substrate which includes the second major surface is a silicon bulk substrate. As for the surface substrate which includes the first major surface, it may be silicon or other types of surface substrates. For example, the surface substrate may be a silicon carbide (SiC) or a sapphire substrate.

The substrate may be a silicon substrate with a (111) crystal orientation (Si(111)). A Si(111) oriented substrate has a surface plane with a (111) crystal orientation. In alternative embodiments, the silicon substrate may have a (100) crystal orientation (Si(100)). A Si(100) oriented substrate has a surface plane with a (100) crystal orientation. In the case of a Si(100) substrate, the first major surface is processed to form V-grooves (not shown) to expose the (111) crystal orientation. For example, the first major surface of a Si(100) substrate may be processed to transform it to be a Si(111) substrate. In one embodiment, the grooves are formed in the LED region of a Si(100) substrate. Non-LED regions of the substrate need not have the grooves. The grooves may be continuous grooves. In other embodiments, the grooves may be discontinuous grooves. A groove or grooves may be selectively provided under an LED in the LED region. The V-grooves may be formed by a wet etch. Alternatively, the V-grooves may be formed by a reactive ion etch (RIE). An etch mask, such a resist mask may be employed in the case the grooves are selectively formed on the substrate.

The substrate may include a doped device well (not shown). The doped device well may be heavily doped with first polarity type dopants. In one embodiment, the doped device well is a heavily doped n-type (n⁺) device well. Alternatively, the device well may be a heavily doped p-type (p⁺) device. The dopant concentration of the heavily doped device well may be about $10^{20}$ atoms/cm³. Other dopant concentrations for the heavily doped device well may also be useful. The dopant concentration may depend on, for example, the technology node. The doped well may be formed by ion implantation. An implant mask, such as a resist mask, may be employed.

A base layer 235 may be disposed on the first major surface of the substrate. The base layer may be a composite base layer having multiple layers. In one embodiment, the base layer includes a first base or nucleation layer and a second base or buffer layer. The nucleation layer is disposed on the substrate and the buffer layer is disposed on the nucleation layer. The nucleation layer facilitates in forming the buffer layer on the substrate. In one embodiment, the nucleation layer facilitates in growing a buffer layer with a wurtzite crystal structure.

The nucleation layer may be an aluminum nitride (AlN) layer and the buffer layer may be a gallium nitride (GaN) layer. Other types of nucleation layers which facilitate growing a buffer layer with a wurtzite crystal structure, such as GaN, or other types of buffer layers with a wurtzite crystal structure may also be useful. Non-wurtzite nucleation layers may also be useful. The base layers may be formed by metal organic chemical vapor deposition (MOCVD) or molecular beam epitaxy (MBE). Other techniques for forming the base layers may also be useful. The thickness of the nucleation layer may be about 50-200 nm while the buffer layer may be about 0.5-2 um. Other thicknesses for the nucleation and buffer layers may also be useful. In the case of grooves on the top surface of the substrate, the base layer may be planarized to form a planar surface. This results in the second base layer having a planar top surface. Alternatively, the second base layer is planarized to form a planar top surface.

The top surface of the substrate includes LEDs 222 in the LED region. Although 4 LEDs are shown, it is understood that the device includes many more LEDs. The LEDs are configured to form multi-color LED pixels. A multi-color pixel, for example, includes a red (R) LED, a green (G) LED and a blue (B) LED. For example, the multi-color pixel is a RGB pixel. In some embodiments, a multi-color pixel may include a plurality of R LEDs, G LEDs and B LEDs. Numerous multi-color LED pixels are configured to form a display.

Various types of LEDs may be employed for the LED pixels of the display. The LEDs, in one embodiment, are multiple quantum well (MQW) LEDs. A MQW LED includes a MQW disposed on an LED base. The base may be, for example, an LED body. The base may be a GaN base. The base, in one embodiment, is a first polarity type base, such as a n-doped base. The base, in one embodiment, is a n-doped GaN (n-GaN) base. Providing a p-doped base, such as a GaN (p-GaN) base, may also be useful.

The base may be formed by SEG or other techniques, such as MBE or MOCVD. The base may be medium doped based. For example, the dopant concentration of the base may be about $1E^{18}$ atoms/cm³. Other dopant concentrations for the base may also be useful. The base may be doped by in situ doping or ion implantation. The base serves as a first terminal of a MQW LED. In the case of a n-doped base, it serves as a cathode terminal of the MQW. Alternatively, a p-doped base serves as an anode terminal of the MQW LED.

To facilitate forming the base 218, a body mask layer, such as silicon nitride, may be employed. The body mask layer is disposed over the base layer. For example, the body mask layer may be formed by CVD and patterned using mask and etch techniques to form openings to expose the base layer for forming the base layer thereon.

As for the MQW, it includes y quantum wells (QWs), where y is ≥2. The MQW may include about 2-6 QWs. In one embodiment, a MQW includes two QWs. Other number of QWs may also be useful. The number of QWs may depend on, for example, the desirable optical efficiency. A quantum well includes a well layer sandwiched by barrier layers. The barrier layer may be served by a barrier layer from a previous or subsequent QW or by an LED base.

In one embodiment, the well layer of a QW includes an indium gallium nitride (InGaN) layer and a barrier layer includes a GaN layer. The layers of the MQW may be formed by SEG. The GaN barrier layer may be an undoped layer or a layer doped with first polarity type dopants. The thickness of the well layer may be about 3 nm while the thickness of the barrier layer is about 12 nm. Other thicknesses may also be useful. For example, in the case where the barrier layer is served by the body or top LED layer, the thickness of the barrier layer may be thicker. Other configurations of the well and barrier layers may also be useful.

A top LED layer may be disposed over the MQW. Disposed between the top LED layer and MQW is an electron blocking layer (not shown). The electron blocking layer (EBL), for example, may be an undoped aluminum gallium nitride (AlGaN) layer. Other types of EBLs may also be useful. The top LED layer may be a second polarity type doped top LED layer, such as a p-doped top LED layer. In one embodiment, the top LED layer is a second polarity type GaN layer. For example, the top LED layer may be a p-GaN layer.

The various layers of the MQW as well as the blocking and top LED layers may be formed by SEG, MBE or MOCVD. Other processes for forming the layers may also be useful. For doped layers, they may be doped by in situ doping or ion implantation. The top LED layer serves as a second terminal of a MQW LED. In the case of a p-doped top LED layer, it serves as an anode terminal of the MQW LED. Alternatively, a n-doped top LED layer serves as a cathode terminal of the MQW LED.

The multi-color MQW LEDs may be non-stacked fin-type or nanowire multi-color MQW LEDs, as described in concurrently filed U.S. patent application Ser. No. 15/599,458 titled LEDs WITH THREE COLOR RGB PIXELS FOR DISPLAYS, which is already herein incorporated by reference for all purposes. LED bodies are disposed on the substrate over the base layer exposed by the body mask layer 215.

In the case of fin-type nanowire LEDs, first polarity type doped GaN fin bodies are provided on the substrate. For example, n-GaN fin bodies are provided on the substrate. A fin body is an elongated member of an LED pixel. The elongated member may be disposed along a first direction of the substrate. The height of the fin body may be about 1 um and a length of the fin body in the row direction may be about 5 um. Other dimensions for the fin body may also be useful. The first direction, for example, may be referred to as a row direction. For example, a fin body is disposed along the row direction. In the case of (100) silicon substrate with grooves, the fin body is disposed in the direction of the V-grooves. For example, the V-grooves and the fin body are disposed along the row direction. A fin body may serve as a common fin body for pixels of the display in the row direction. Other configurations of fins may also be useful. Other configurations of fin bodies may also be useful. For example, different pixels have separate fin bodies.

A fin body may include R, G and B LEDs of a pixel. The R, G and B LEDs are disposed on a fin body and separated from each other. The G LED is disposed between the R and B LED on the fin body. The fin body serves as a common first terminal for the LEDs on the fin. A pixel may include a plurality of fin bodies with R, G and B LEDs.

In the case of a nanowire LED, the LED base is a nanowire body. The nanowire body may be an elongated member having a circular cross-sectional shape disposed on the substrate. Providing other cross-sectional shaped nanowire bodies may also be useful. The nanowire body extends from the substrate in a direction perpendicular to its surface. The nanowire body may have a height sufficient to accommodate the LED base. In one embodiment, the nanowire body has a height of about 1 um and a diameter of about 200 nm. Other nanowire body dimensions may also be useful. In one embodiment, the side of the nanowire body extending from the substrate surface may be along a m-plane while the top of the body may be along a c-plane. Other configurations of nanowire bodies may also be useful.

In other embodiments, the LEDs may be multi-color stacked MQW LEDs. A multi-color stacked MQW LEDs may include B, G and R LEDs stacked on an LED body. The LED body may be a fin-type or a nanowire body. For example, the multi-color stacked MQW LEDs may be fin-type or nanowire multi-color stacked MQW LEDs. The LEDs of a stack may be overlapping LEDs or non-overlapping LEDs. The various types of multi-color stacked MQW LEDs are described in concurrently filed U.S. patent application Ser. No. 15/599,427 titled LIGHT EMITTING DIODES (LEDs) WITH STACKED MULTI-COLOR PIXELS FOR DISPLAYS, which is already herein incorporated by reference in its entirety for all purposes.

The different color LEDs have different bandgaps. In one embodiment, the different bandgaps for different color LEDs are achieved by varying the percentage of indium (In) in the well layers of the MQW. In one embodiment, the percentage of In of the InGaN layer of the well layers of the MQW is varied to achieve different bandgaps for different color LEDs. For example, x defines the percentage (atomic percent) of In in the $In_xGa_{1-x}N$ well layer. In one embodiment, the percentage of in for the $In_xGa_{1-x}N$ layer in the MQW may be as follows:

Blue: x=15-20%;
Green: x=25-30%; and
Red: x=35-40%.

Other percentages of In may be useful, as long as the different bandgaps have sufficient separation. For example, different percentages of In results in different QW bandgaps which emit different wavelength of light.

In one embodiment, the base for the different color LEDs have different widths. For example, in the case where the base is a fin, the fin portion of the different color LEDs may have different widths. In the case of a nanowire body, the bodies of different color LEDs have different widths or diameters. The different widths facilitate having different percentages of In in the well layers of the MQW. The well layers with higher In percentage is facilitated with a narrower base or base portion. The term base may refer to a base or a portion of a base. In one embodiment, the width of the base for the R LED is less than about 100 nm, the width of the base for the G LED is about 200 nm while the width of the base of the B LED is greater than about 300 nm. In other embodiments, the width of the base for the R LED is about 25-125 nm, the width of the base for the G LED is about 150-250 nm while the width of the base of the B LED is greater than about 300-400 nm. Other widths for different bases portion may also be useful.

A metal layer 219 is disposed on the substrate over the mask layer. The metal layer may represent an LED metal level, such as LM or LM1. The metal layer may be an aluminium (Al) or tungsten (W) metal layer. Other types of metal layers, including transparent conductive oxides (TCO), such as indium tin oxide (ITO), or transparent conductive layers, such as graphene, may also be useful. The metal layer may have a thickness of about 0.25 um. Other thicknesses may also be useful. The metal layer is patterned to form metal lines or plates. Metal lines may refer to metal lines or metal plates. A metal line is a planar metal line which contacts a top LED layer at sides of the lower portion of the LEDs. For example, a metal line does not conformally cover the LEDs. In one embodiment, a metal line couples a group of LEDs of a pixel with same color. A metal line includes a contact region and serves as a common second LED terminal of the LEDs of a pixel with the same color. The second terminal, for example, is an anode terminal.

To form the metal lines, a metal layer is formed on the substrate. The metal layer may be formed on the substrate by, for example, sputtering. An etch back process may be performed to recess the metal layer. The etch back process may be selective to the top LED layer. The recessed metal layer may be patterned using mask and etch techniques to form the metal lines. Other techniques for forming metal lines may also be useful.

A via dielectric layer 230, such as silicon oxide, is disposed over the LEDs and substrate. The dielectric layer may serve as an LED via level in which LED via contacts are provided to contact second terminals of the LEDs. For example, via contacts 238 are disposed in the dielectric layer which are coupled to contact regions of the metal lines. The contacts, for example, are Al or W contacts. Other types of contacts may also be useful. The contacts may serve as reflective mirrors.

To form the via dielectric layer with contacts, a single damascene process may be used. This includes forming dielectric layer, such as silicon oxide, on the substrate by CVD. The dielectric layer covers the metal lines and fills the gaps between the LEDs. A planarization process, such as chemical mechanical polish (CMP), may be performed to remove excess dielectric material and to form a planar top surface with the top of the LEDs. Via openings are formed in the via dielectric layer to expose contact regions of the metal lines. A conductive layer, such as Al or W, is formed on the substrate, filling the via openings. Excess conductive material is removed by CMP, leaving via contacts in the via opening. The via contacts and via dielectric layer have coplanar top surfaces.

A top dielectric layer may be disposed over the via dielectric layer. The top dielectric layer may be a silicon oxide layer with metal pads 239 coupled to via contacts. The metal pads, for example, may be copper or copper alloy pads. Other types of pads, such as Al or W pads, may also be useful. In addition, the top dielectric layer may include metal pads (pad metal pads) for pad contacts 236 disposed outside of the LED region. The metal pads in the top dielectric layer may be formed by a single damascene process, similar to that described for forming the via contacts in the via dielectric layer. Other techniques for forming the metal pads, such as RIE, may also be useful. In RIE, a conductive layer is deposited and patterned to form metal pads. The top dielectric layer is formed on the substrate by CVD to fill the gaps between the metal pads followed by CMP to remove excess dielectric material.

In one embodiment, the top surface of the top dielectric layer serves as a bonding surface to the BP device. For example, an LED device is an inverted LED device having the top surface of the top dielectric layer bonded to the BP device. After bonding the LED device to the BP device, the LEI) substrate is removed, exposing the base layer.

A transparent electrode 237, such as TCO or graphene, is disposed over the base layer in the LED region. The transparent electrode serves as a common first electrode for the LEDs. For example, the transparent electrode serves as a common cathode terminal for the LEDs. The transparent electrode may be formed by, for example, sputtering. Other forming techniques may also be useful. The transparent electrode layer may be patterned using mask and etch techniques, leaving the transparent electrode in the LED region.

The via dielectric layer includes contacts (not shown) for coupling to the transparent electrode. The contacts extend through body mask and base layers. The contacts are coupled to metal pads in the top dielectric layer.

The transparent electrode, base layer and body mask are disposed in the LED region of the LED device. A fill dielectric layer may be disposed in the non-LED regions of the LED device. The fill dielectric layer and the transparent electrode have coplanar top surfaces.

A passivation layer 280 is disposed over the transparent electrode. The passivation layer, for example, may be a silicon nitride or other materials with good light transparency. Other types of passivation layers may also be useful. The passivation layer includes pads 292 which are coupled to pad metal pads by pad contacts in the via dielectric and fill dielectric layers. The pads may be Al pads. Other types of conductive pads may also be useful. The passivation layer includes pad openings to expose the pads. The pads provide external connections to the device. For example, wire bonds may be provided to the pads for externally connecting the device.

The BP device, as shown includes first and second major surfaces 240a-b. The first surface may be referred to as the top BP surface for bonding with the LED device. The BP device includes a BP substrate 241. The BP substrate, for example, may be a silicon substrate. Other types of substrates, including a COI substrate may also be useful. The BP substrate includes first and second major surfaces. The first or top surface includes CMOS components. The CMOS components include CMOS transistors 242, such as thin film transistors (TFTs). A TFT may be disposed in a transistor region. The transistor region may be isolated from other component regions by a shallow trench isolation (STI) region 249. The STI region, for example, surrounds a transistor region. Different STI regions may be provided for different device regions. In addition, the STI regions may have different widths, depending on layout and design requirements.

To form STI regions, isolation trenches are formed on the substrate. The trenches may be formed by mask and etch techniques. For example, a resist mask may be exposed with a reticle with the desired pattern. The mask is developed to transfer the reticle pattern to the resist mask, serving as an etch mask. An etch, such as a reactive ion etch, is performed using the patterned etch mask to form the trenches. In some cases, the trenches are formed using a hard mask, such as a silicon nitride mask. The mask is patterned using a patterned resist mask. The hard mask serves as an etch mask for an RIE to form the trenches. A dielectric layer such as silicon oxide, is deposited on the substrate and planarized by a chemical mechanical polish (CMP). The CMP forms a planar top surface with, for example, the substrate. Other techniques for forming STI regions may also be useful.

A transistor well 241 is disposed in a transistor region. A transistor well includes second polarity type dopants for a first polarity type transistor. For example, a p-well is provided for a n-type transistor and a n-well is provided for a p-type transistor. The BP device includes both n-type and p-type transistors.

A transistor well is formed by, for example, ion implantation. An implant mask, such as a patterned resist mask, serves as a mask for selectively implanting dopants in the substrate to form a transistor well. An implant may be used to form same type transistor wells. For example, p-type transistor wells and n-type transistor wells are formed in separate implant processes. A dopant activation anneal may be performed after forming the transistor wells.

A transistor includes a gate 243 disposed on the substrate surface and first and second source/drain (S/D) regions $244_{1-2}$ on first and second sides of the gate. The gate includes a gate electrode over a gate dielectric. The S/D regions are first polarity type doped regions, corresponding to a first polarity type device.

To form transistors, gate layers are formed on the substrate. The gate dielectric may be a silicon oxide layer formed by thermal oxidation. The gate electrode layer may be a polysilicon layer formed by chemical vapor deposition (CVD). The gate layers are patterned to form gates using mask and etch techniques.

In some embodiments, a (S/D) region includes a lightly doped (LD) extension region. The LD extension region is a lightly doped region which extends under the gate while the S/D regions are displaced from the gate by dielectric gate sidewall spacers. To form S/D regions with LD extension regions, LD extension implants are performed after forming the gate. P-type and n-type extension regions are formed by separate extension implants. After the extension implants, dielectric spacers are formed on the sidewalk of the gates. The spacers may be formed by depositing a spacer dielectric layer on the substrate followed by an anisotropic etch, such as RIE. The etch removes horizontal portions of the spacer layer, leaving spacers on sidewalls of the gates. Separate p-type and n-type S/D implants are performed for p-type and n-type transistors.

Metal silicide contacts may be disposed on the contact regions on the BP substrate. For example, metal silicide contacts, such as nickel-based metal silicide contacts may be included in on the contact regions, such as S/D regions, gate electrodes and well contacts. The metal silicon contacts may be formed by depositing a metal layer over the substrate. An anneal is performed to cause a reaction with the silicon substrate and metal to form metal silicide. Unreacted metal is removed by, for example, wet etch, leaving metal silicide contacts over the contact regions.

A back-end-of-line (BEOL) dielectric 250 is disposed on the top surface of the CMOS substrate, covering the FEOL components. The BEOL dielectric includes a plurality of interlevel dielectric (ILD) layers 252. An ILD layer includes a contact level 254 with via contacts 255 and a metal level 256 with metal lines 257. An ILD layer may be formed using various processes. For example, single damascene, dual damascene, and/or reactive ion etch techniques may be employed. Other techniques may also be employed to form ILD layers of the BEOL dielectric. The contacts may be W or copper contacts while the metal lines may be copper lines. Other types of contacts and metal lines may also be useful. Other types of BEOL components may also be included in the BEOL dielectric.

As shown, the BEOL dielectric may include 3 ILD levels. The first ILD level includes CA and M1, the second ILD level includes V1 and M2 and the third ILD level includes V2 and M3. Providing other number of ILD levels may also be useful. For example, the BEOL dielectric may include 3-8 ILD levels. The number of ILD levels may depend on the CMOS process and design requirements.

The CA and M1 levels may be formed using single damascene process. For example, a CA dielectric is formed on the substrate. Via openings are formed in the CA dielectric layer which exposes contact regions on the substrate. A conductive layer, such as W is deposited on the substrate, filling the via openings. Other types of conductive materials may also be useful. Excess conductive material may be removed by CMP, forming contacts in the CA dielectric layer. As for M1, a M1 dielectric layer is formed over the CA dielectric. Trenches are formed in the M1 dielectric corresponding to metal lines or metal pads. The trenches are filled with a conductive material, such as copper. Other types of conductive materials may also be useful.

As for the upper ILD levels, they may be formed by dual damascene processes. In a dual damascene process, an ILD dielectric layer is formed. The dielectric layer is patterned to form via openings in the lower portion and trench openings in the upper portion. A conductive material, such as copper, may be formed on the substrate, filling the via and trench openings. Other types of conductive materials may also be useful. Excess conductive material may be removed by CMP, forming contacts and metal lines in the via level and metal level of the ILD dielectric layer. In one embodiment, the top ILD level serves as a bonding surface which is bonded to the bonding surface of the LED device. The top ILD level includes metal pads which are coupled to metal pads on the bonding surface of the LED device.

In one embodiment, through silicon via (TSV) contacts are provided. The TSV contacts extend through the surfaces of the BP substrate to provide electrical connections to the CMOS components and the LED device. A TSV contact includes a conductive contact 246. The conductive contact may be a copper contact. Other types of TSV contacts may also be useful. In one embodiment, the TSV contact includes an isolation collar 247. The isolation collar, for example, is a silicon oxide collar surrounding the conductive contact. A top of the contact is coupled to a contact in the CA level of the BEOL dielectric while a bottom is exposed on the bottom surface 240*b* of the BP substrate.

The device includes a redistribution layer (RDL) 260 which includes top and bottom RDL surfaces. The top RDL surface is disposed on the bottom surface of the BP substrate. For example, the top RDL surface is disposed on the bottom surface 240*b* of the BP device. The RDL may include a plurality of RDL metal dielectric layers 266 and RDL via dielectric layers 264. A RDL metal dielectric layer includes RDL metal lines 277 and a RDL via dielectric level includes RDL via contacts 275. The RDL lines and contacts may be Al, W, copper or other types of conductive materials. As shown, the RDL includes 3 RDL metal dielectric layers and 2 RDL via dielectric layers. Other number of RDL metal layers may also be useful. For example, the RDL may include 2-4 RDL metal layers. The top and bottom RDL surfaces are RDL metal layers. The top RDL surface includes interconnections to the TSV contacts. The bottom RDL surface includes metal SoC die pads.

The top RDL layer may be formed by a single damascene process while the other RDL metal and via layers may be formed using a dual damascene process. In other embodiments, the different RDL layers may be formed individually by single damascene processes. Other techniques such as subtractive metal etching, for example, RIE, for forming the RDL layers may also be useful.

The chip pads may include bumps. For example, the chip pads may be metal pads. Metal bumps, such as copper bumps may be included. Other types of bumps may also be useful. A plurality of SoC dies $270_{1-n}$ are bonded to the bumps on the die pads. For example, die bonds on the dies are bonded to the bumps by die bonding.

Mold compound 285 may be provided to encapsulate the SoC dies. The mold compound may be an injection mold compound, such as an epoxy resin. Other types of mold compounds may also be useful.

Figure 3:
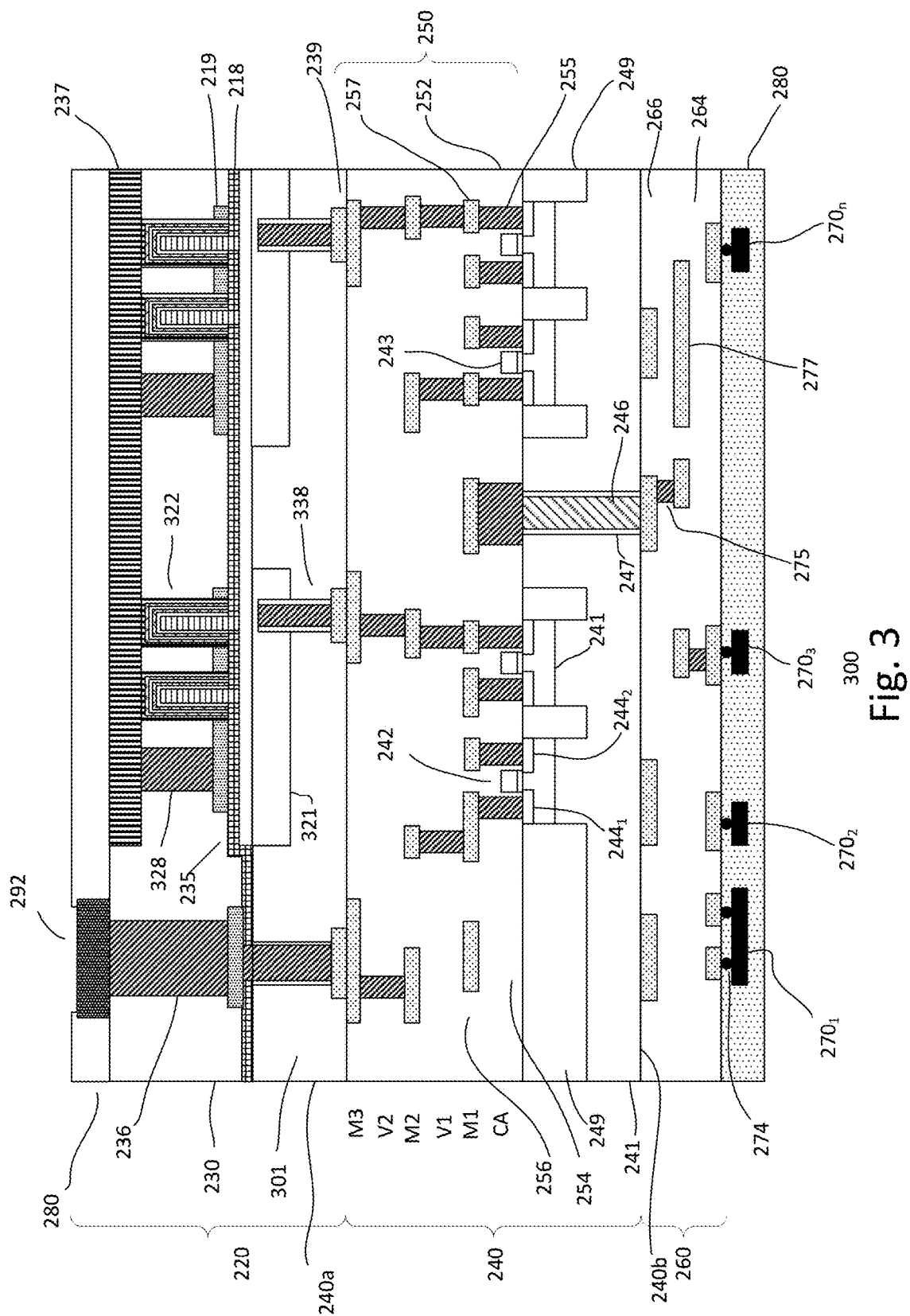

FIG. 3 shows a simplified cross-sectional view of an embodiment, of a device 300. The device is similar to that described in FIG. 2. Common elements may not be described or described in detail. The device includes an LED device 220 bonded to a BP device 240. Disposed on a bottom surface of the BP device is a RDL 260 on which a plurality of SoC chips $270_{1-n}$ are bonded. The device may be part of or originally part of an LED wafer with a plurality of LED devices and BP wafer with plurality of BP devices. The wafer may be diced to singulate the devices into individual devices.

The LED device includes an LED substrate 301. The substrate includes top and bottom major surfaces. The top major surface may be referred to as the LED surface and the bottom major surface may be referred to as the second major surface. The top surface includes an LED region in which LEDs 322 are formed. The top surface may include other non-LED regions.

The substrate may include a doped device wells 321. A device well may be provided for each LED pixel. The doped device well may be heavily doped with first polarity type dopants. In one embodiment, the doped device well is a heavily doped n-type ($n^+$) device well. Alternatively, the device well may be a heavily doped p-type ($p^+$) device. The dopant concentration of the heavily doped device well may be about $10^{20}$ atoms/cm$^3$. Other dopant concentrations for the heavily doped device well may also be useful. The dopant concentration may depend on, for example, the technology node.

A base layer 235 may be disposed on the top surface of the substrate. In one embodiment, the base layer includes a first base or nucleation layer and a second base or buffer layer. The nucleation layer is disposed on the substrate and the buffer layer is disposed on the nucleation layer. The nucleation layer may be an aluminum nitride (AlN) layer and the buffer layer may be a gallium nitride (GaN) layer.

The top surface of the substrate includes LEDs 322 in the LED region. Although 4 LEDs are shown, it is understood that the device includes many more LEDs. The LEDs are configured to form multi-color LED pixels. A multi-color pixel, for example, includes a red (R) LED, a green (G) LED and a blue (B) LED. For example, the multi-color pixel is a RGB pixel. In some embodiments, a multi-color pixel may include a plurality of R LEDs, G LEDs and B LEDs. Numerous multi-color LED pixels are configured to form a display.

The LEDs may be multiple quantum well (MQW) LEDs. A MQW LED includes a MQW disposed on an LED base, such as an LED body. A body mask layer 218 is disposed on the substrate, covering the base layer and top substrate surface. The body mask exposes the base layer when the LED bodies are to be formed. A top LED layer may be disposed over the MQW. Disposed between the top LED layer and MQW is an electron blocking layer. The top LED layer, in one embodiment, is a second polarity doped layer, such as a p-GaN layer. Alternatively, the top LED layer may be a n-GaN layer. The top LED layer serves as a second terminal of the LED and the LED body serves as a first terminal of the LED.

A metal layer 219 is disposed on the substrate over the body mask layer. The metal layer may represent an LED metal level, such as LM or LM1. The metal layer may be an aluminum (Al) or tungsten (W) metal layer. Other types of metal layers, including transparent conductive oxides (TCO), such as indium tin oxide (ITO), or transparent conductive layers, such as graphene, may also be useful. The metal layer may have a thickness of about 0.25 um. Other thicknesses may also be useful.

The metal layer is patterned to form metal lines or plates. Metal lines may refer to metal lines or metal plates. A metal line is a planar metal line which contacts a top LED layer at sides of the lower portion of the LEDs. For example, a metal line does not conformally cover the LEDs. In one embodiment, a metal line couples a group of LEDs of a pixel with same color. A metal line includes a contact region. Other configurations of metal lines may also be useful. In addition, the metal layer may be patterned to include metal pads in the non-LED region. The metal pads (pad metal pads) serve as pads for pad contacts 236 disposed outside of the LED region. Other configurations for the metal lines may also be useful.

An LED via dielectric layer 230, such as silicon oxide, is disposed over the LEDs and substrate. The dielectric layer may have a top surface which is coplanar with the top of the LEDs. The dielectric layer may serve as an LED via level in which LED via contacts are provided to contact second terminals of the LEDs. For example, via contacts 328 are disposed in the dielectric layer which are coupled to contact regions of the metal lines. The contacts, for example, are Al or W contacts. Other types of contacts may also be useful. The contacts may also serve as reflective mirrors.

A transparent electrode 237, such as TCO or graphene, is disposed over the LED via dielectric layer. The transparent electrode layer, as shown, is in the LED region of the LED via dielectric layer. The transparent electrode is disposed on top of the LEDs in the LED region. The transparent electrode contacts the top LED layers of the LEDs, serving as a common second LED terminal. In one embodiment, the common second LED terminal is a common anode terminal of the LEDs. As for the wells, they are configured to serve as common first terminal for same color LEDs of a pixel. For example, different color LEDs of a pixel have different wells. The doped wells may be formed using an implant mask having the desired pattern. In one embodiment, the first electrode is an anode terminal.

A fill dielectric layer may be disposed in the non-LED regions of the LED device. The fill dielectric layer and the transparent electrode have coplanar top surfaces.

A passivation layer 280 is disposed over the transparent electrode. The passivation layer, for example, may be a silicon nitride or other materials with good light transparency. Other types of passivation layers may also be useful. The passivation layer includes pads 292 which are coupled to pad metal pads by pad contacts in the via dielectric and fill dielectric layers. The pads may be Al pads. Other types of conductive pads may also be useful. The passivation layer includes pad openings to expose the pads. The pads provide external connections to the device. For example, wire bonds may be provided to the pads for externally connecting the device.

In one embodiment, LED TSV contacts 338 are provided in the LED substrate. An LED TSV contact includes a conductive contact and a dielectric collar. The TSV contacts extend from the bottom surface of the LED substrate to LED terminals. In one embodiment, LED TSV contacts are provided to contact the LED wells 321. LED TSV contacts are also provided to couple to the pad metal pads.

A TSV contact includes a conductive contact 246. The conductive contact may be a copper contact. Other types of TSV contacts may also be useful. In one embodiment, the TSV contact includes an isolation collar 247. The isolation collar, for example, is a silicon oxide collar surrounding the conductive contact. A top of the contact is coupled to a contact in the CA level of the BEOL dielectric while a bottom is exposed on the bottom surface of the BP substrate.

A bottom LED dielectric layer may be disposed over the bottom surface of the LED substrate layer. The dielectric layer may be a silicon oxide layer with metal pads 239 coupled to the TSV contacts. The metal pads, for example, may be copper or copper alloy pads. Other types of pads, such as Al or W pads, may also be useful. In one embodiment, the surface of the bottom dielectric layer serves as a bonding surface to the BP device. As for the BP device, the RDL and the SoC chips, they are the same or similar as that described in FIG. 2.

FIGS. 4A-G show simplified cross-sectional views of an embodiment of a process 400 for forming a device. The device is similar to that described in FIGS. 1A-D and 2-3. Common elements may not be described or described in detail.

Figure 4A:
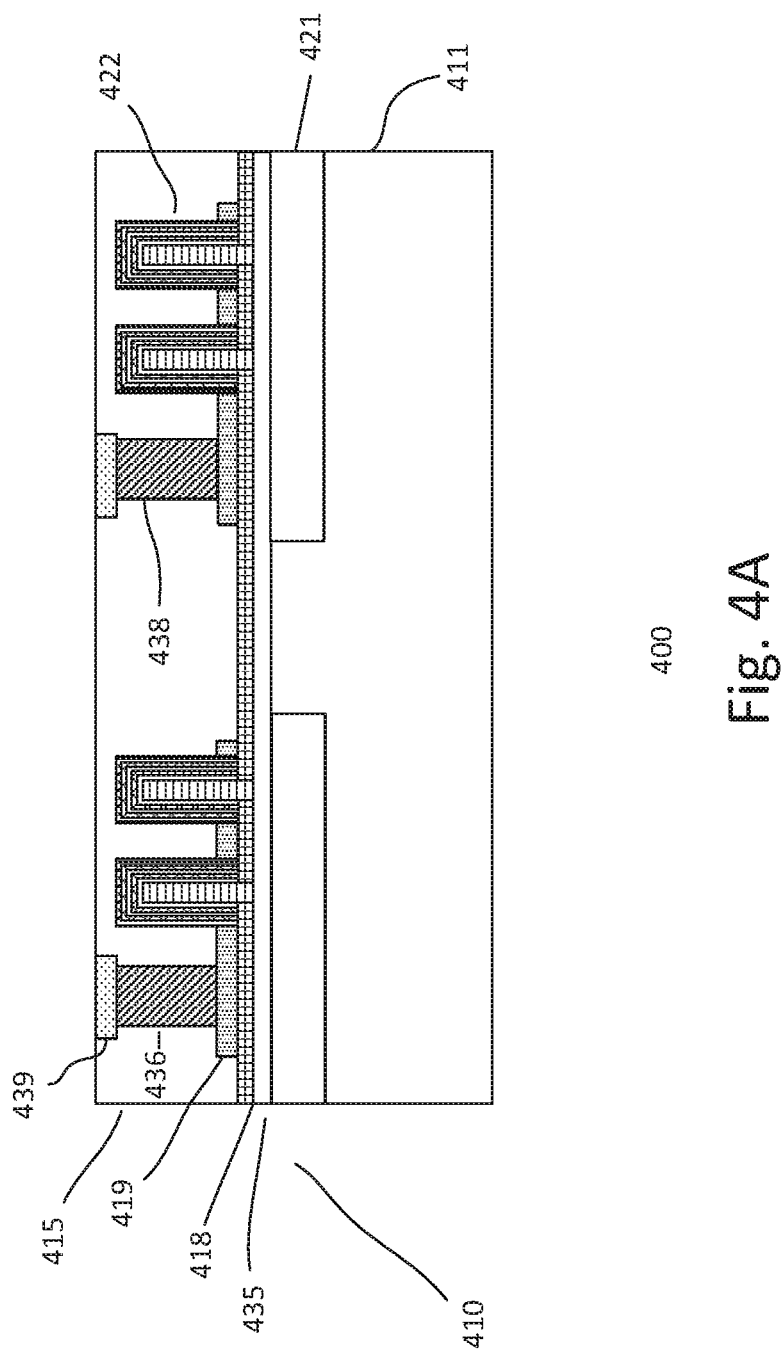
FIGS. 4A-G show simplified cross-sectional views of a process for forming a device.

Referring to FIG. 4A, an LED wafer 410 is processed with a plurality of LED devices. Details of the LED device are described with respect to FIG. 2. For example, an LED device includes a substrate 411 which is part of an LED wafer. The substrate may include LED and non-LED regions. The LED region includes doped wells 421, such as $n^+$ doped wells. A base layer 435 is disposed over the substrate. Above the base layer is a body mask layer 418. The body mask layer is patterned to provide openings for forming LED bodies of MQW LEDs. The LED bodies serve as the base for MQW LEDs. For example, a MQW is formed on an LED body. A top LED layer is disposed over the MQW separated by an EBL layer. An LED body serves as a first LED terminal and a top LED layer serves as a second LED terminal of an LED. The first LED terminal may be a cathode terminal and the second LED terminal may be an anode terminal.

Conductive lines or plates 419 couple LEDs 422 of the device. Conductive lines may refer to conductive plates. The conductive lines, for example, represent a first metal layer or LM1 of the LED device. The conductive lines are electrical couple to the second terminals of the LEDs. The LEDs are color LEDs and are configured into a RGB display. For example, the color LEDs are configured into rows and columns of RGB pixels to form a RGB display. A dielectric layer 415 is disposed on the substrate covering the LEDs. The dielectric layer includes via contacts 438 coupled to the conductive lines and metal pads 439 in the LED region. In addition, metal pads may be provided in the non-LED region for pad contacts. The metal pads have top surfaces which are coplanar with the top surface of the dielectric layer. The top surface of the dielectric layer serves as the LED bonding surface.

In one embodiment, the LEDs are fin-type MQW LEDs with fin bodies. Alternatively, the LEDs are nanowire MQW LEDs with nanowire bodies. Other types of LEDs may also useful. For example, the LEDs may be a RGB stacked fin-type or nanowire MQW LEDs. The RGB stacked LEDs may be overlapping or non-overlapping stacked MQW LEDs.

Figure 4B:
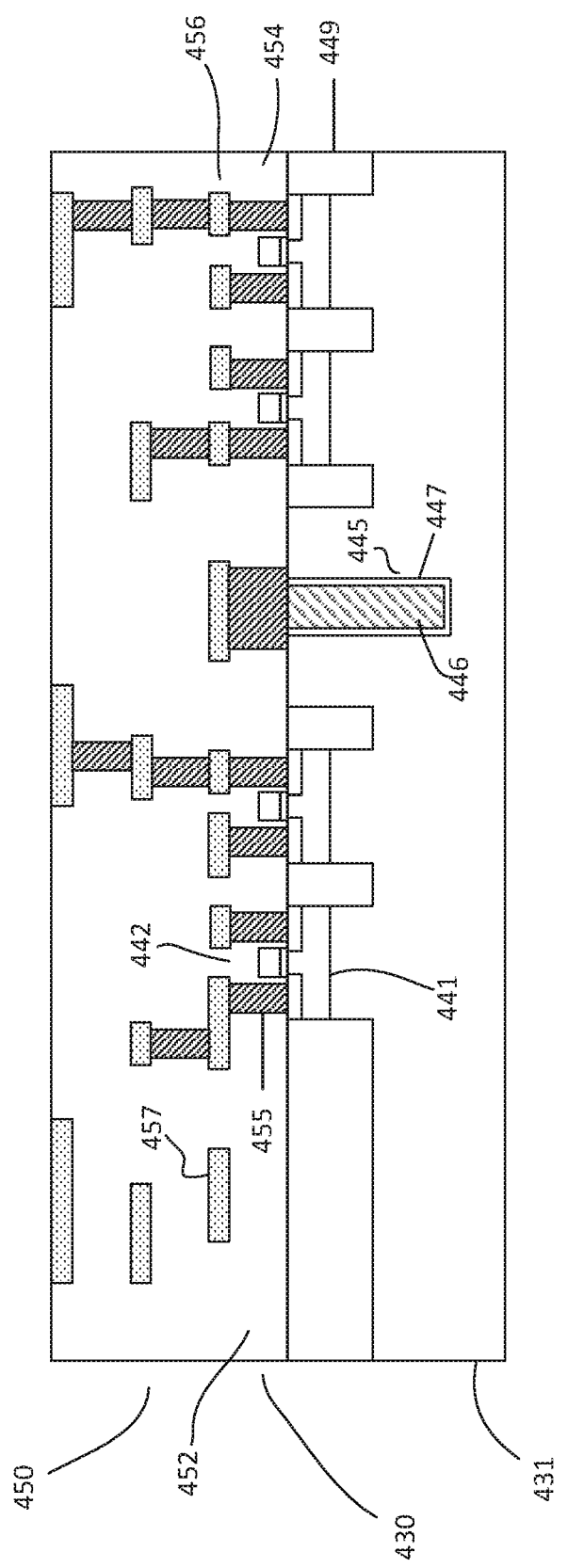

In FIG. 4B, a BP wafer 430 is processed with a plurality of BP devices. Details of the BP device are described with respect to FIGS. 2-3. For example, a BP device includes a BP substrate 431 which is part of a BP wafer. The BP substrate includes top and bottom surfaces. The top surface includes CMOS components 442 isolated by isolation regions 449, such as STI regions. The BP device includes TSV contacts 445 extending into the substrate from the top surface. A TSV contact includes a conductive contact 446 disposed in a TSV opening lined with a dielectric layer 447.

A BEOL dielectric 450 is formed over the top BP substrate surface. The BEOL dielectric covers the CMOS components. The BEOL dielectric includes a plurality of ILD levels 452. An ILD level includes a via dielectric level 454 with contacts 455 and a metal dielectric level 456 with metal lines 457. The BEOL dielectric may include 3-8 ILD levels. Alternatively, the BEOL dielectric may include other number of ILD levels depending on design requirements. As shown, the BEOL dielectric includes 3 ILD level. Contacts and metal lines in the first metal level are coupled to the TSV contacts. The TSV contacts may also be coupled to contacts and metal lines of upper ILD levels. As for the top surface of the BEOL dielectric layer, it serves as a BP bonding surface and includes metal pads.

Figure 4C:
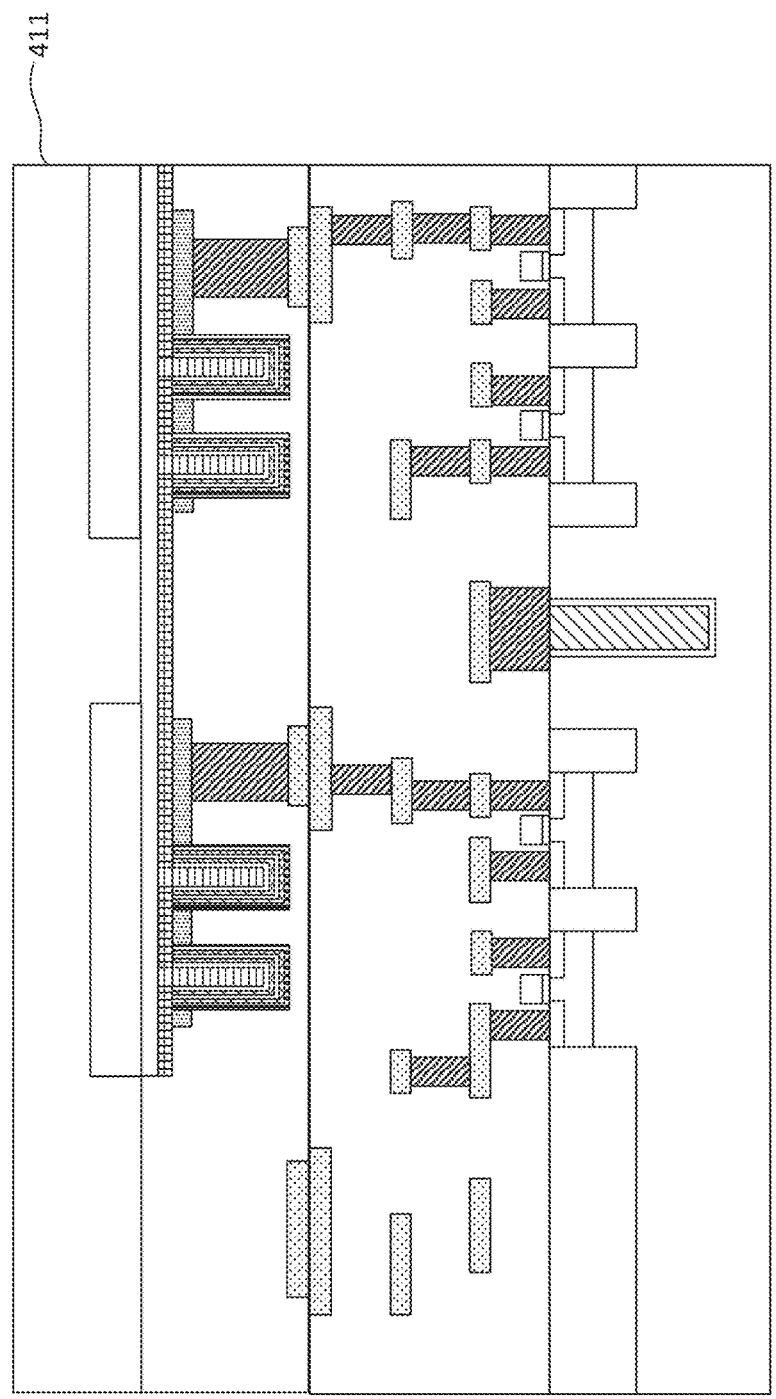

As shown in FIG. 4C, the LED wafer 410 and BP wafer 430 are bonded together. In one embodiment, the LED bonding surface and the BP bonding surface are bonded together. The bonding surfaces may be bonded using fusion bonding. Other wafer bonding techniques may also be useful. The metal pads on the BP bonding surface and the metal pads on the LED bonding surfaces provide electrical connection between the devices of two wafers.

Figure 4D:
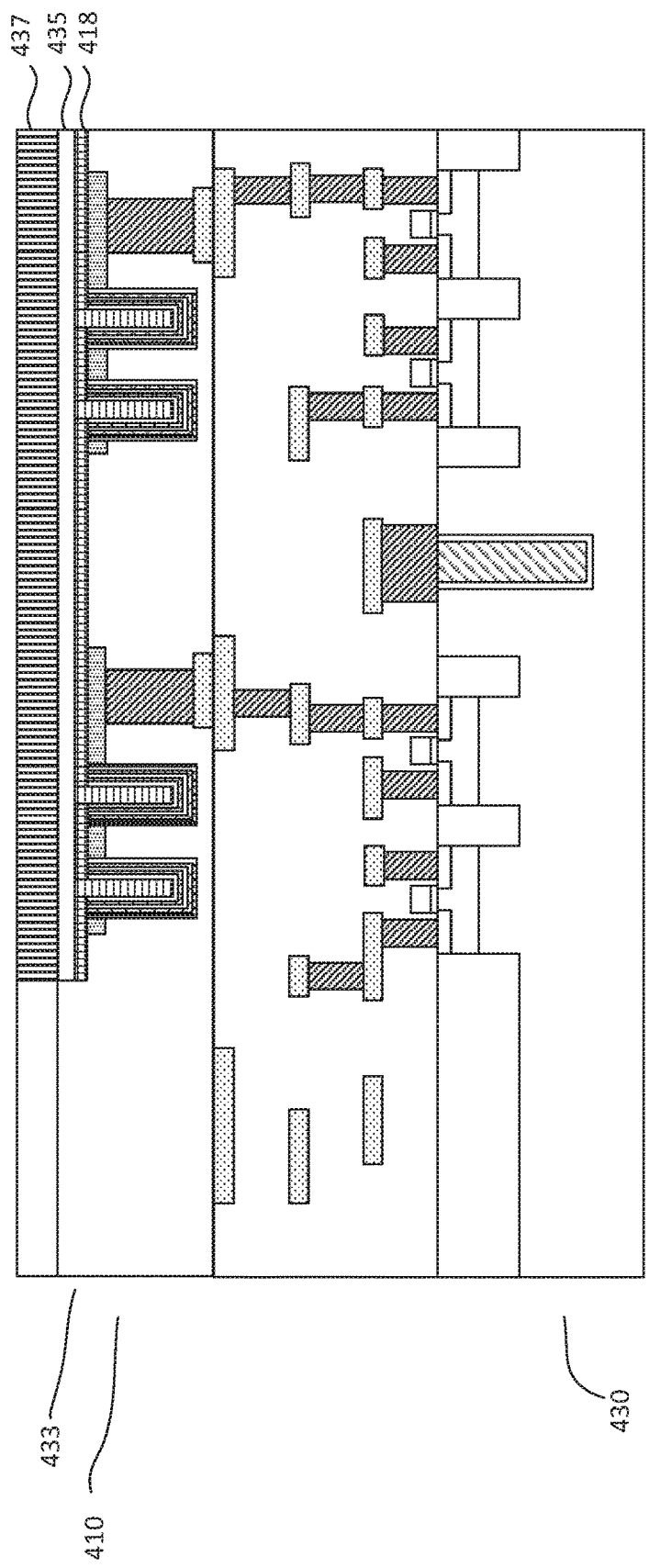

Referring to FIG. 4D, LED wafer is separated from the LEDs. In one embodiment, laser lift off techniques may be used to remove the LED wafer. Alternatively, the LED wafer may be removed by a CMP. Other techniques of removing the wafer also be useful. Removing the LED wafer exposes the base layer 435. In one embodiment, a transparent electrode layer 437 is formed on the base layer. The transparent electrode layer, for example, may be a TCO layer, such as ITO. Other types of transparent conductive materials, such as graphene may also be used to form the transparent electrode layer. The transparent electrode layer may be formed by, for example, sputtering.

After forming the transparent electrode layer, it is patterned using mask and etch techniques. In one embodiment, patterning the transparent electrode layer also patterns the base layer 435 and mask layer 418. As shown, the layers are patterned, removing the layers from the non-LED region. A fill dielectric layer 433 is formed on the substrate. The fill dielectric layer may be a silicon oxide layer. The fill dielectric layer is planarize to remove excess dielectric material, leaving a planar top surface with the transparent electrode.

Figure 4E:
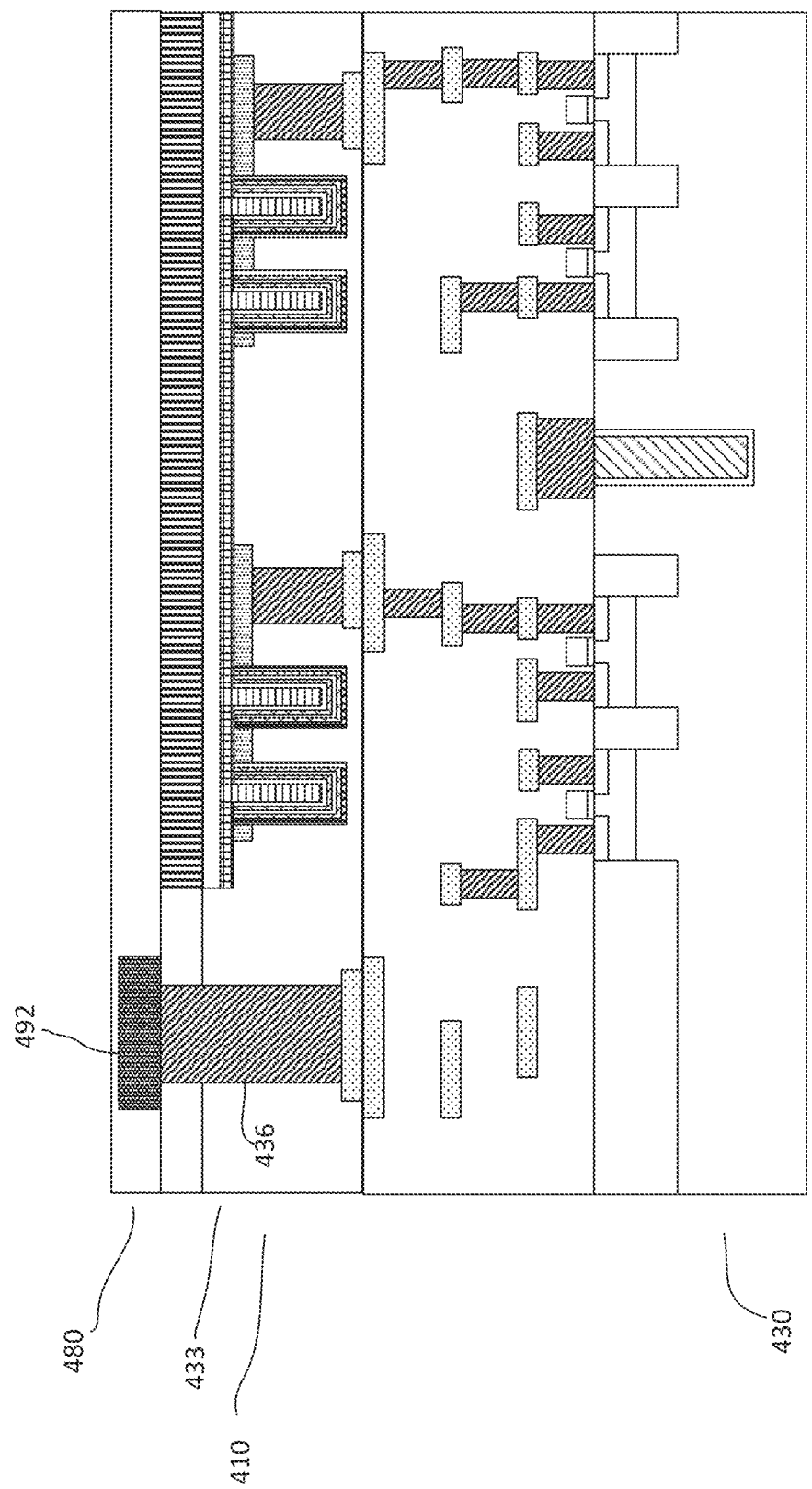

In FIG. 4E, pad contacts 436 are formed in the dielectric layer in the non-LED region. The pad contacts are coupled to the metal pads on the LED bonding surface. Pad via openings may be formed in the dielectric layer using mask and etch processes. The pad via openings are filled with a conductive material, such Al, W or Copper. Excess conductive material may be removed by, for example, CMP, leaving pad contacts in the pad via openings. The process continues to form metal bond pads 492 and a passivation layer 480.

Figure 4F:
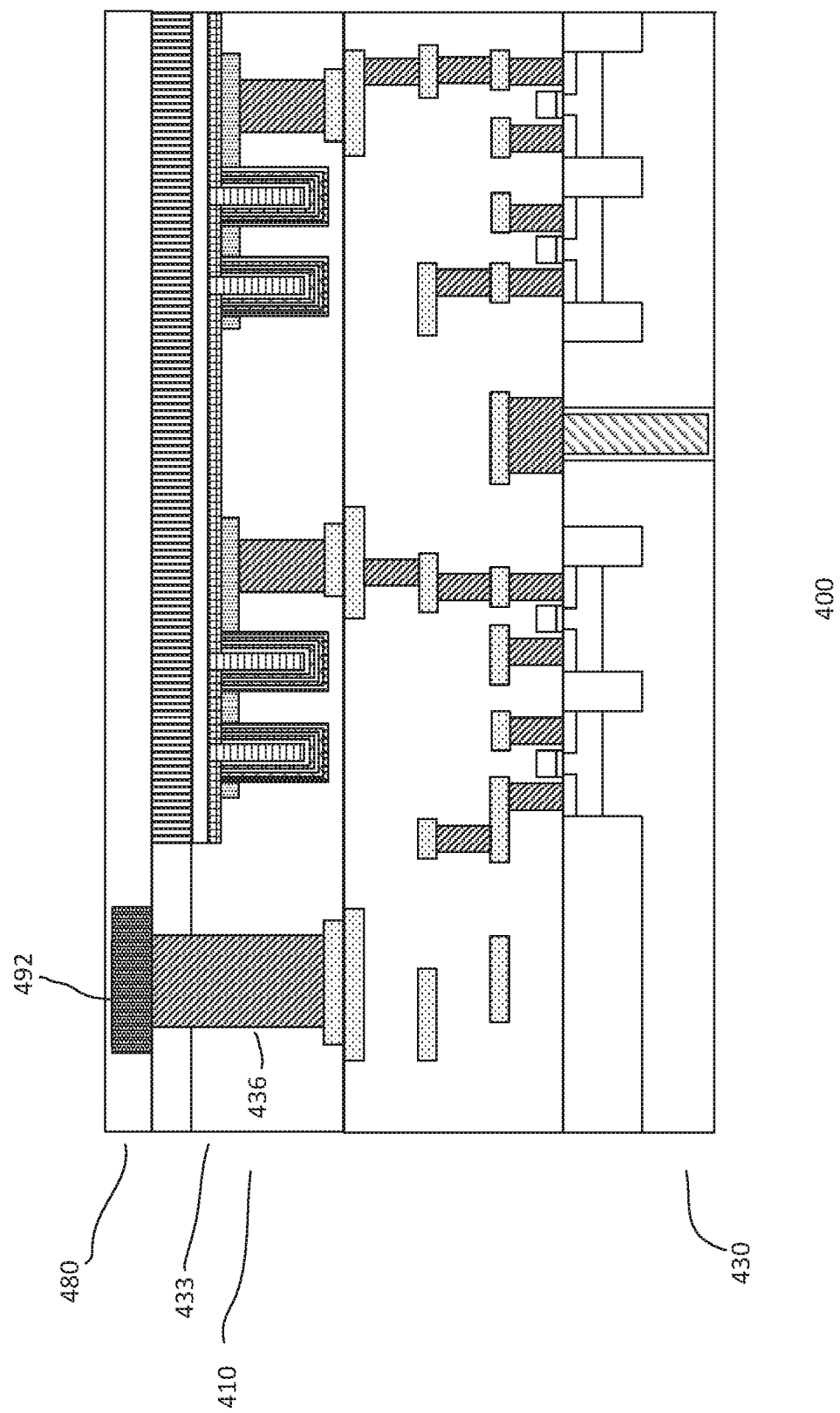

Referring to FIG. 4F, the bottom surface of the BP wafer 430 is thinned. The BP wafer may be thinned by backgrinding. Other techniques for thinning the wafer, such as CMP may also be useful. The bottom surface is thinned until the TSV contact is exposed.

Figure 4G:
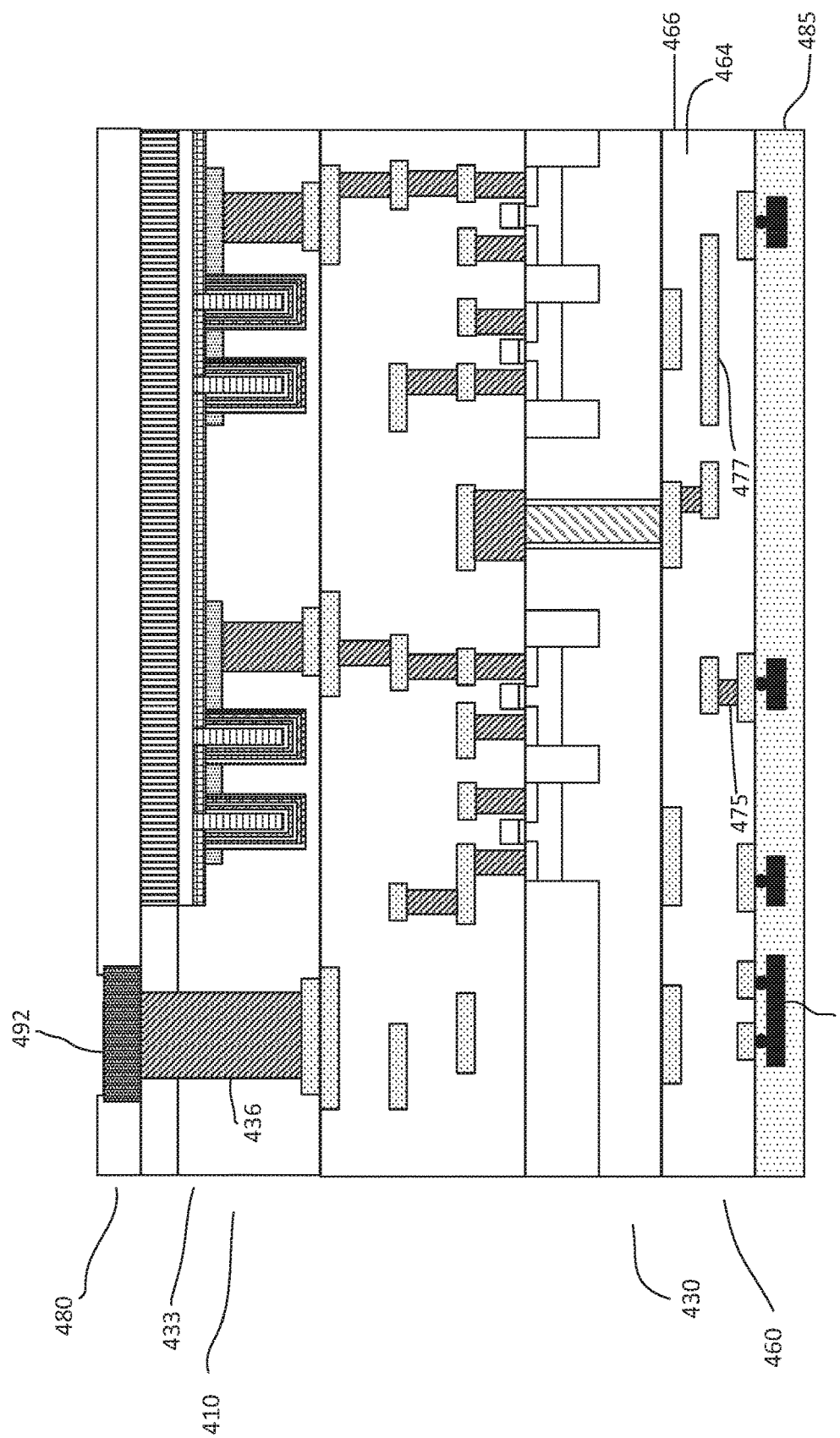

After thinning the bottom surface to expose the TSV contacts, a redistribution layer (RDL) 460 is formed, as shown in FIG. 4G. The RDL may be formed using BEOL processes. In one embodiment, a first dielectric layer of the RDL is formed. The first dielectric layer may be patterned to form lines which are coupled to the TSV contact. The RDL includes top and bottom RDL surfaces. The top RDL surface is disposed on the bottom surface of the BP substrate. For example, the top RDL surface is disposed on the bottom surface 240b of the BP device. The RDL layer may include a plurality of RDL metal dielectric layers 266 and RDL via dielectric layers 264. A RDL metal dielectric layer includes RDL metal lines 477 and a RDL via dielectric level includes RDL via contacts 475. The RDL lines and contacts may be Al, W, copper or other types of conductive materials. As shown, the RDL includes 3 RDL metal dielectric layer and 2 RDL via dielectric layers. Other number of RDL metal layers may also be useful. For example, the RDL may include 2-4 RDL metal layers. The top and bottom RDL surfaces are defined by an upper-most and a bottom-most RDL metal dielectric layer. The top RDL surface includes interconnections to the TSV contacts. The bottom RDL surface includes metal SoC die pads.

The upper-most RDL metal dielectric layer may be formed by a single damascene process while the other RDL metal and via dielectric layers may be formed using a dual damascene process to form the various metal lines and via contacts. In other embodiments, the different RDL dielectric layers may be formed individually by single damascene processes. Other techniques such as subtractive metal etching, for example, RIE, for forming the RDL dielectric layers may also be useful.

After forming the RDL, the SoC die pads are prepared with metal bumps, such as copper bumps. A plurality of SoC dies or chips 470 of the display system are provided. The SoC dies may be prepared with metal bumps, such as copper bumps. The dies are die bonded to the SoC chip pads with the bumps on the bottom RDL surface.

The process continues by performing a pad opening process to expose the bond pads. For example, the passivation layer is etched to form bond pad openings to expose the bond pads 492. After bond pad opening, the wafer stack is diced to singulate the individual system devices, each with an LED device fusion bonded to a BP device with RDL and SoC chips mounted to it. Wire bonding is performed. After wire bonding, the device may be encapsulated by a mold compound 485.

FIGS. 5A-F show simplified cross-sectional views of an embodiment of a process 500 for forming a device. The device is similar to that described in FIGS. 1A-D, 2-3 and 4A-G. Common elements may not be described or described in detail.

Figure 5A:
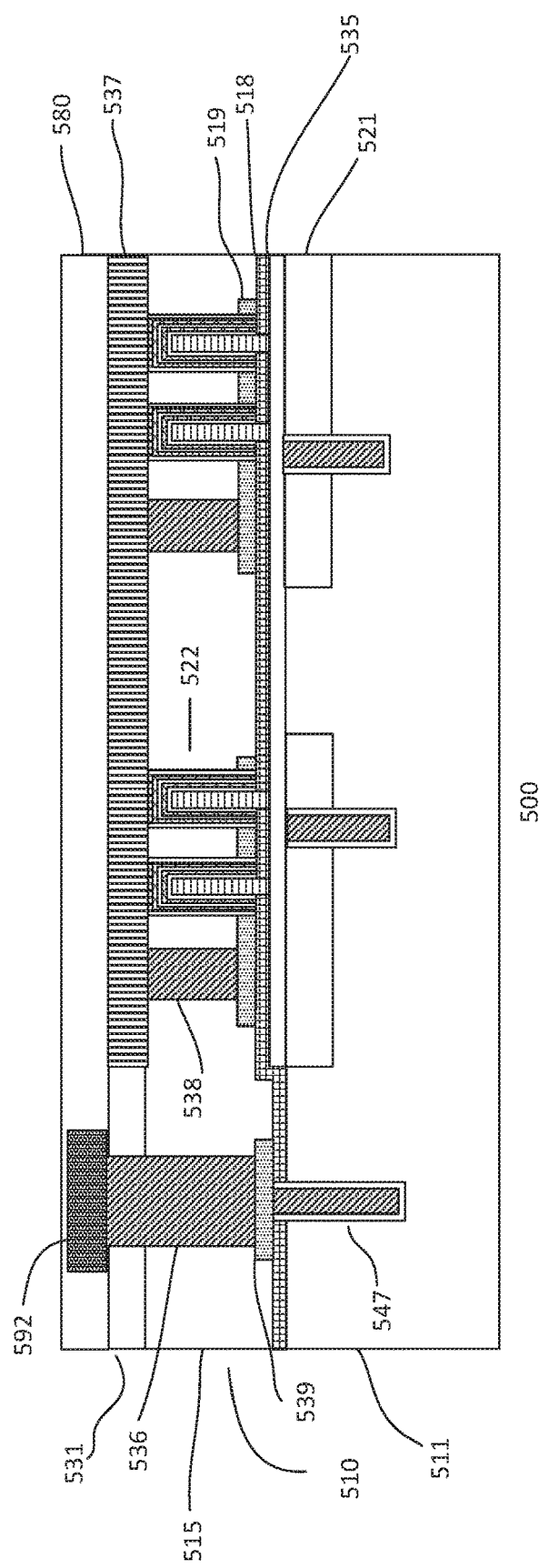
FIGS. 5A-F show simplified cross-sectional views of another process for forming a device.

Referring to FIG. 5A, an LED wafer 510 is processed with a plurality of LED devices. Details of the LED device is described with respect to FIG. 3. For example, an LED device includes a substrate 511 which is part of an LED water. The substrate may include LED and non-LED regions. The LED region includes doped wells 521, such as n+ doped wells. A base layer 535 is disposed over the substrate. Above the base layer is a body mask layer 518. The body mask layer is patterned to provide openings for forming LED bodies of MQW LEDs. The LED bodies serves as the base for MQW LEDs 522 with top LED layers. An LED body serves as a first LED terminal and a top LED layer serves as a second LED terminal of an LED. The first LED terminal may be a cathode terminal and the second LED terminal may be an anode terminal.

Conductive lines or plates 519 couple LEDs of the device. Conductive lines may refer to conductive plates. The conductive lines, for example, represent a first metal layer or LM1 of the LED device. The conductive lines are electrically coupled to the second terminals of the LEDs. The LEDs are color LEDs and are configured into a RGB display. For example, the color LEDs are configured into rows and columns of RGB pixels to form a RGB display. In addition, LM1 includes metal pads 539 in the non-LED region. The conductive lines and metal pads are formed by patterning the LM1 metal layer.

A dielectric layer 515 is disposed on the substrate covering the LEDs, metal lines and metal pads. The dielectric layer is planarized to form a coplanar top surface with the top of the LEDs. For example, the top LED layers are exposed. The dielectric layer includes via contacts 538 coupled to the conductive lines and contacts to the device wells 521. A transparent electrode 537 is disposed on the dielectric over the LEDs in the LED region. The electrode is patterned, removing portions in the non-LED region. A dielectric fill layer 531 fills the gap in the non-LED region created by patterning the transparent electrode layer. The dielectric fill layer is planarized by CMP to form a coplanar top surface with the transparent electrode. Pad contacts 536 are formed in the dielectric layer in the non-LED region. The pad contacts are coupled to the metal pads 539. A passivation layer 580 with bond pads 592 is disposed over the dielectric layer and transparent electrode. The passivation layer covers the bond pads.

In one embodiment, the LEDs are fin-type MQW LEDs with fin bodies. Alternatively, the LEDs are nanowire MQW LEDs with nanowire bodies. Other types of LEDs may also useful. For example, the LEDs may be a RGB stacked fin-type or nanowire MQW LEDs. The RGB stacked LEDs may be overlapping or non-overlapping stacked MQW LEDs.

In one embodiment, TSV contacts 547 are provided. The TSV contacts are disposed in the substrate. The TSV contacts, for example, are formed from the top surface of the LED substrate. A TSV contact includes a conductive contact in a TSV lined with a dielectric layer. First TSV contacts are disposed in the substrate and contact the device wells 521, second TSV contacts (not shown) are disposed in the substrate and contact metal lines 519 and third TSV contacts are disposed in the substrate and contact the metal pads 539.

Figure 5B:
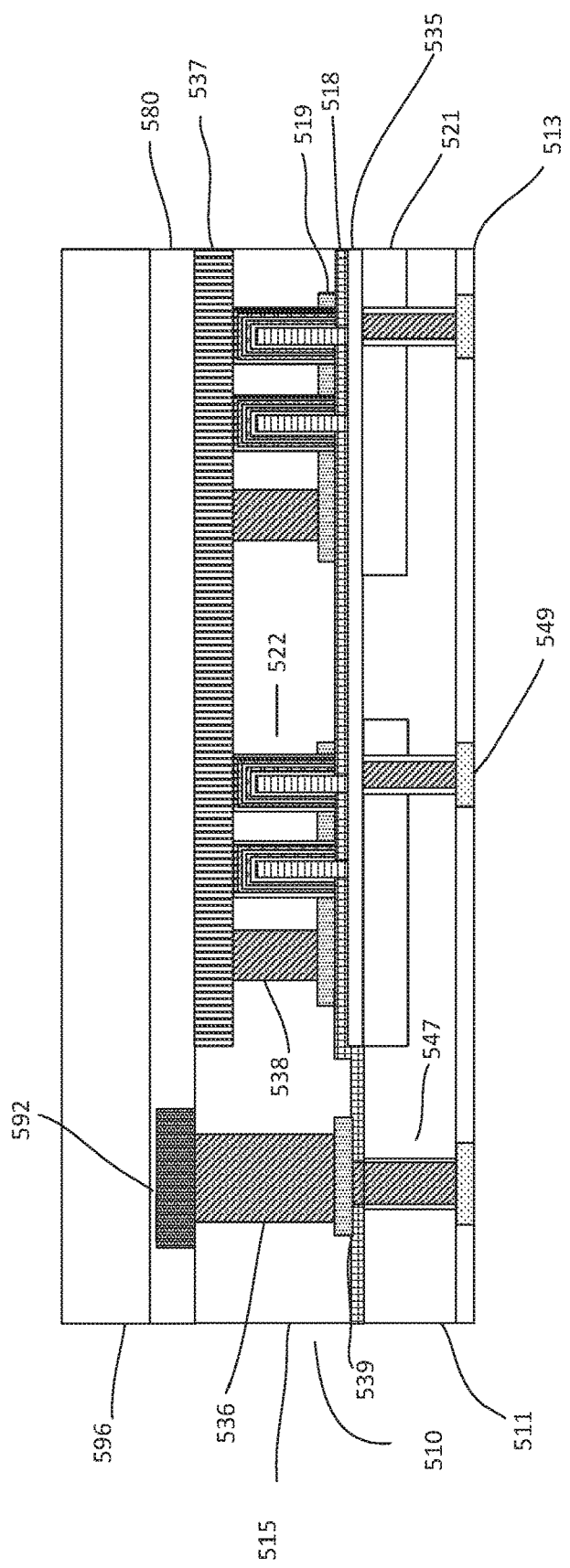

In FIG. 5B, a carrier wafer 596 is attached to the passivation layer. After attaching the carrier wafer, the backside of the LED wafer is thinned to expose the TSV contacts. The backside of the LED wafer may be thinned by, for example, CMP. Other wafer thinning techniques may also be useful. Metal pads 549 are formed on the bottom surface of the LED wafer. The metal pads may be formed in a dielectric layer 513 disposed on the bottom surface of the LED. Single damascene or subtractive metal processes may be used to form the metal pads in the dielectric layer. The dielectric layer with metal pads serves as the LED bonding surface.

Figure 5C:
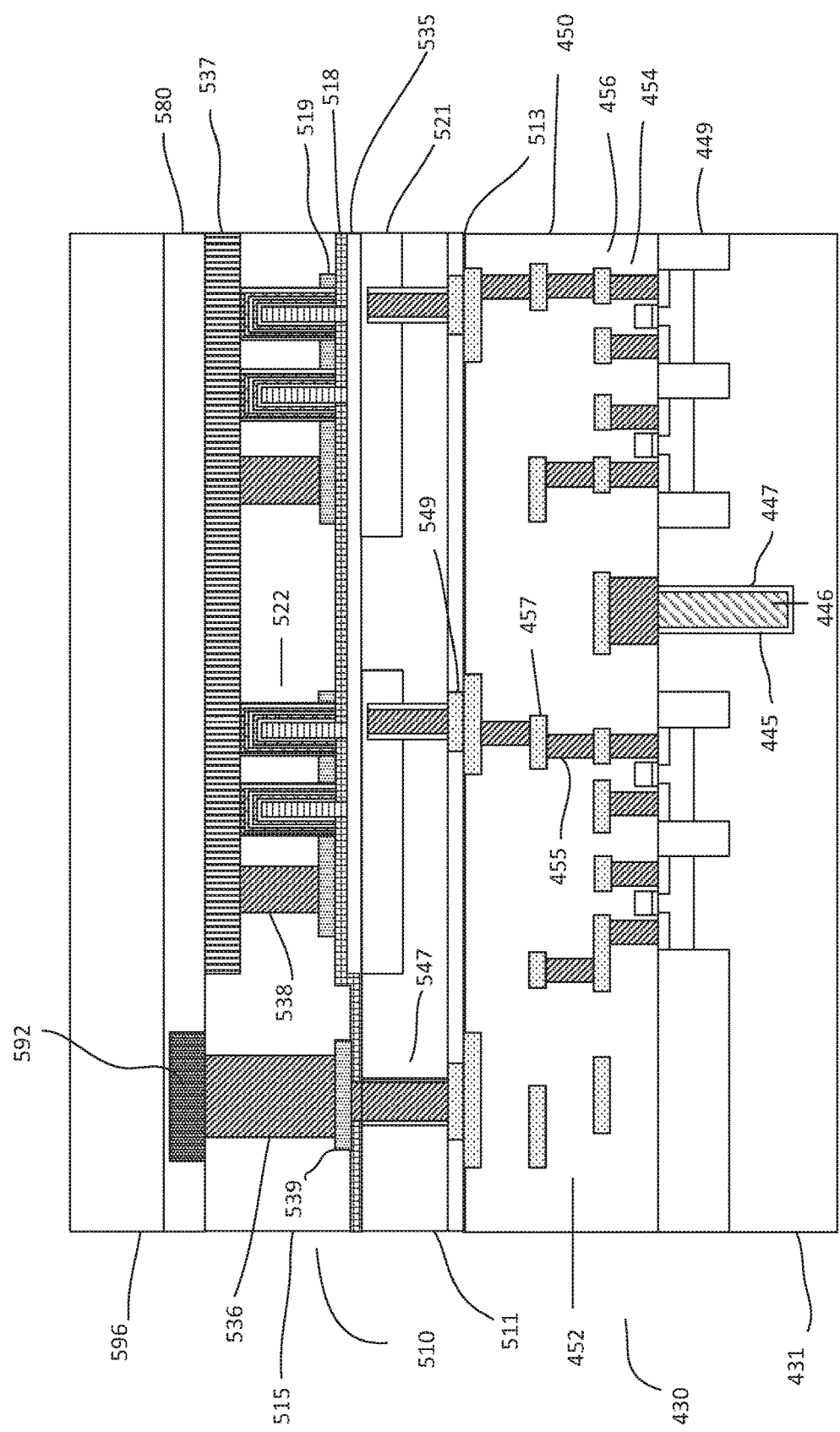

In FIG. 5C, a BP wafer 430 is processed with a plurality of BP devices. Details of the BP device is described with respect to FIGS. 2-3. For example, a BP device includes a BP substrate 431 which is part of a BP wafer. The BP substrate includes top and bottom surfaces. The top surface includes CMOS components 442 isolated by isolation regions 449, such as STI regions. The BP device includes TSV contacts 445 extending into the substrate from the top surface, A TSV contact includes a conductive contact 446 disposed in a TSV lined with a dielectric layer 447.

A BEOL dielectric 450 is formed over the top BP substrate surface. The BEOL dielectric covers the CMOS components. The BEOL dielectric includes a plurality of ILD levels 452. In ILD level includes a via dielectric level 454 with contacts 455 and a metal dielectric level 456 with metal lines 457. The BEOL dielectric may include 3-8 ILD levels. The BEOL dielectric may include other number of ILD levels. As shown, the BEOL dielectric includes 3 ILD levels. Contacts and metal lines in the first metal level are coupled to the TSV contacts. The TSV contacts may also be coupled to contacts and metal lines of upper ILD levels. As for the top surface of the BEOL dielectric layer, it serves as a BP bonding surface and includes metal pads.

Figure 5D:
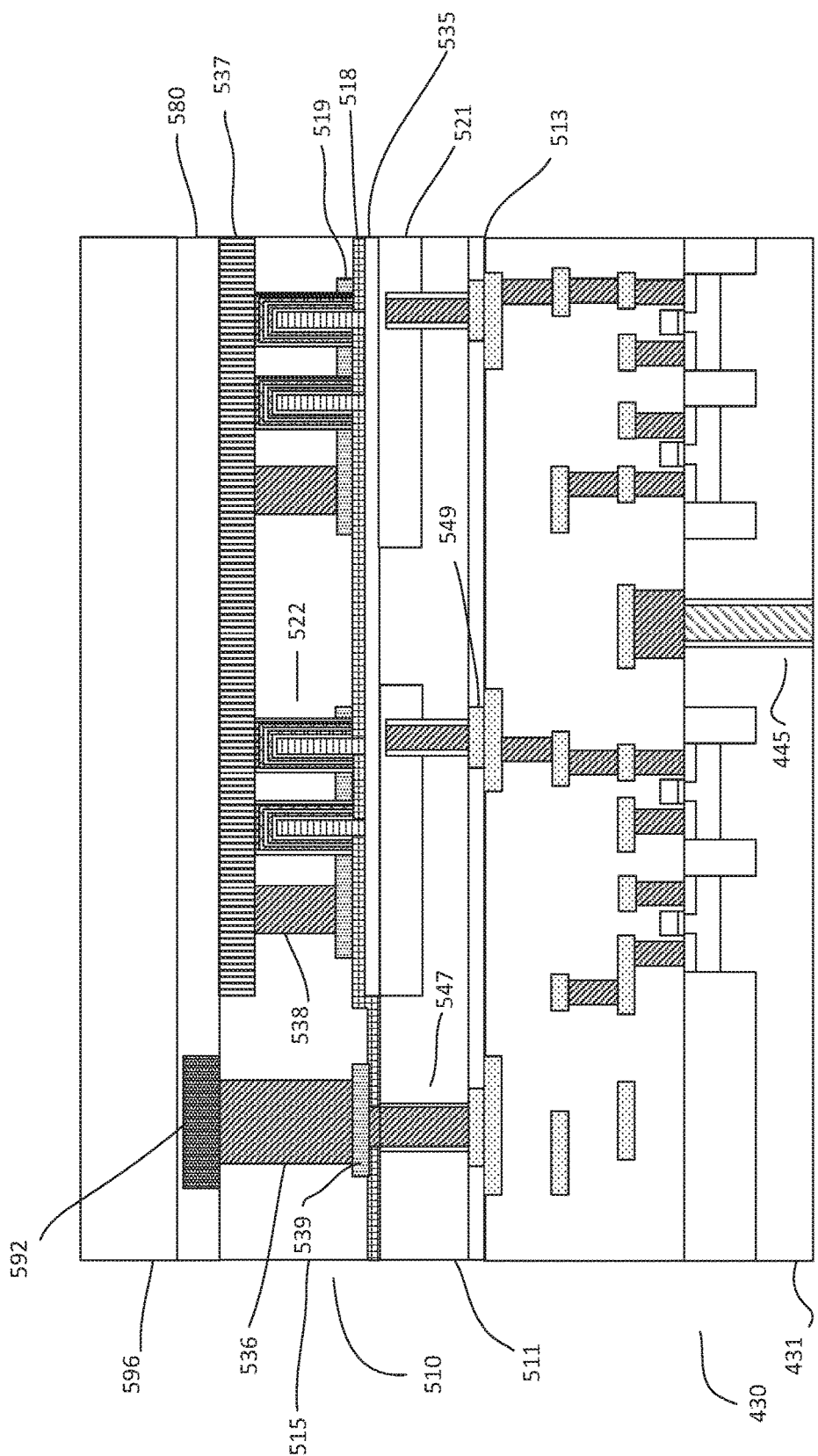

As shown in FIG. 5D, the LED wafer 510 and BP wafer 430 are bonded together to form a wafer stack. In one embodiment, the LED bonding surface and the BP bonding surface are bonded together. The bonding surfaces may be bonded using fusion bonding. For example, hybrid copper-oxide wafer bonding is performed to bond the LED and BP wafers. Other wafer bonding techniques may also be useful. The metal pads on the BP bonding surface and the metal pads on the LED bonding surfaces provide electrical connection between the devices of two wafers. After bonding the wafers, the bottom surface of the BP wafer is thinned by, for example, CMP to expose the TSV contacts 445 in the BP substrate.

Figure 5E:
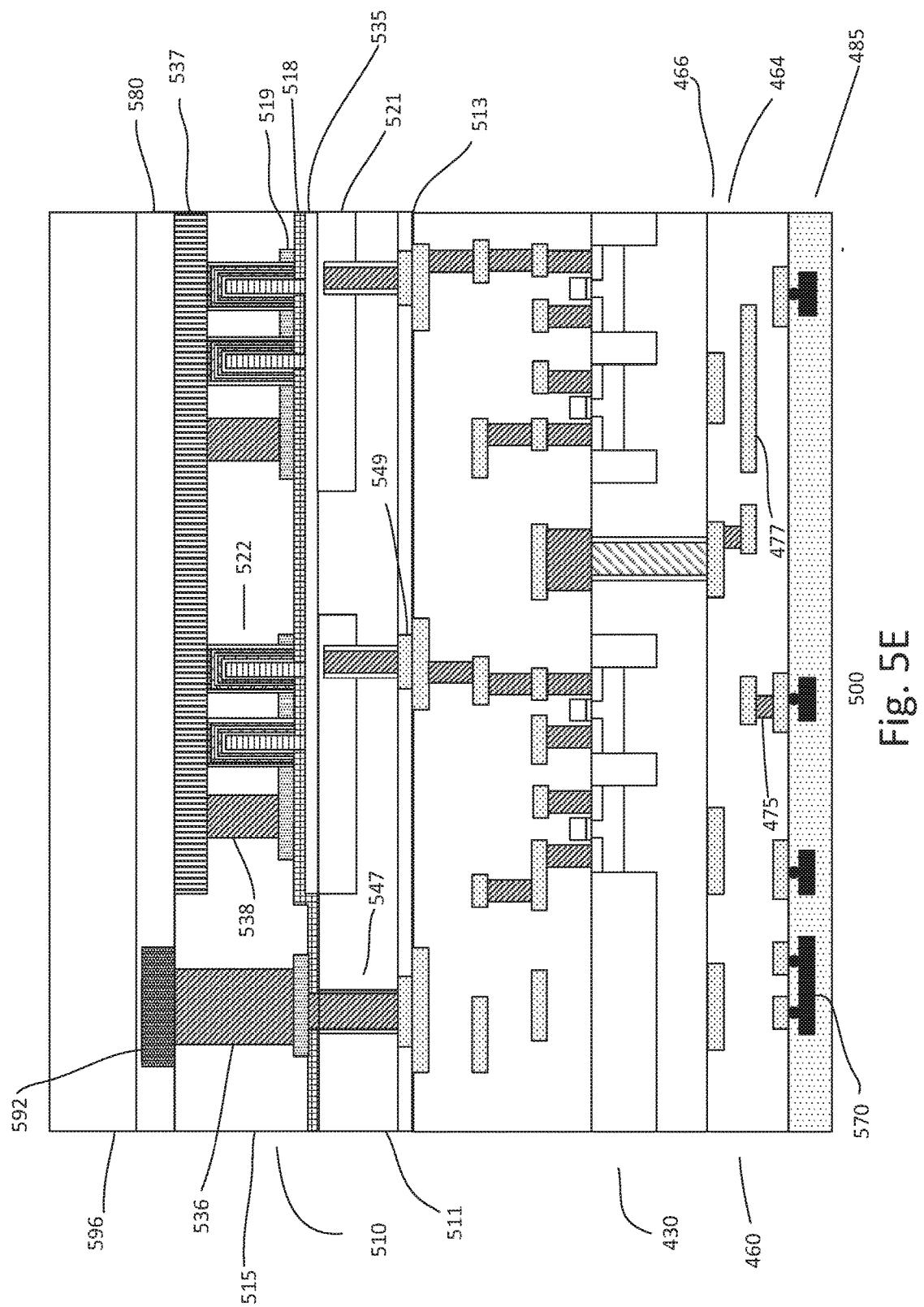

After thinning the bottom surface to expose the TSV contacts, a RDL 460 is formed, as shown in FIG. 5E. The RDL may include a plurality of RDL metal dielectric layers 466 and RDL via dielectric layers 464. A RDL metal dielectric layer includes RDL metal lines 477 and a RDL via dielectric level includes RDL via contacts 475. The RDL lines and contacts may be Al, W, copper or other types of conductive materials. As shown, the RDL includes 3 RDL metal dielectric layers and 2 RDL via dielectric layers. Other number of RDL metal layers may also be useful. For example, the RDL may include 2-4 RDL metal layers.

In one embodiment, the top and bottom RDL surfaces are RDL metal layers. The top RDL surface includes interconnections to the TSV contacts. The bottom RDL surface includes metal SoC die pads. The metal lines and contacts of the different RDL layers are configured to interconnect the SoC die pads to the TSV contacts to provide interconnections to the CMOS components on the BP device and LED device bonded thereto. The SoC die pads are routed to accommodate the various SoC dies of the display system.

The RDL may be formed using BEOL processes. The BEOL processes, such as single damascene, dual damascene and/or subtractive metal etch, such as RIE, may be employed. For example, a combination of different BEOL processes may be employed to form different RDL dielectric layers. In the case of a single damascene process, a dielectric layer is formed on the substrate, vias or trenches may be formed in the dielectric layer using mask and etch techniques. In the case of a dual damascene process, a dielectric layer is patterned to form vias in a lower portion and trenches in an upper portion. The vias and trenches are filled with conductive material. Excess conductive material is removed by CMP, leaving via contacts in the lower portion of dielectric layer and metal lines in the upper portion of the dielectric layer. As for the subtractive metal etch process, a metal layer is formed on the substrate and patterned using mask and etch techniques. A dielectric layer is formed on substrate, filling the gaps in the patterned metal layer.

Figure 5F:
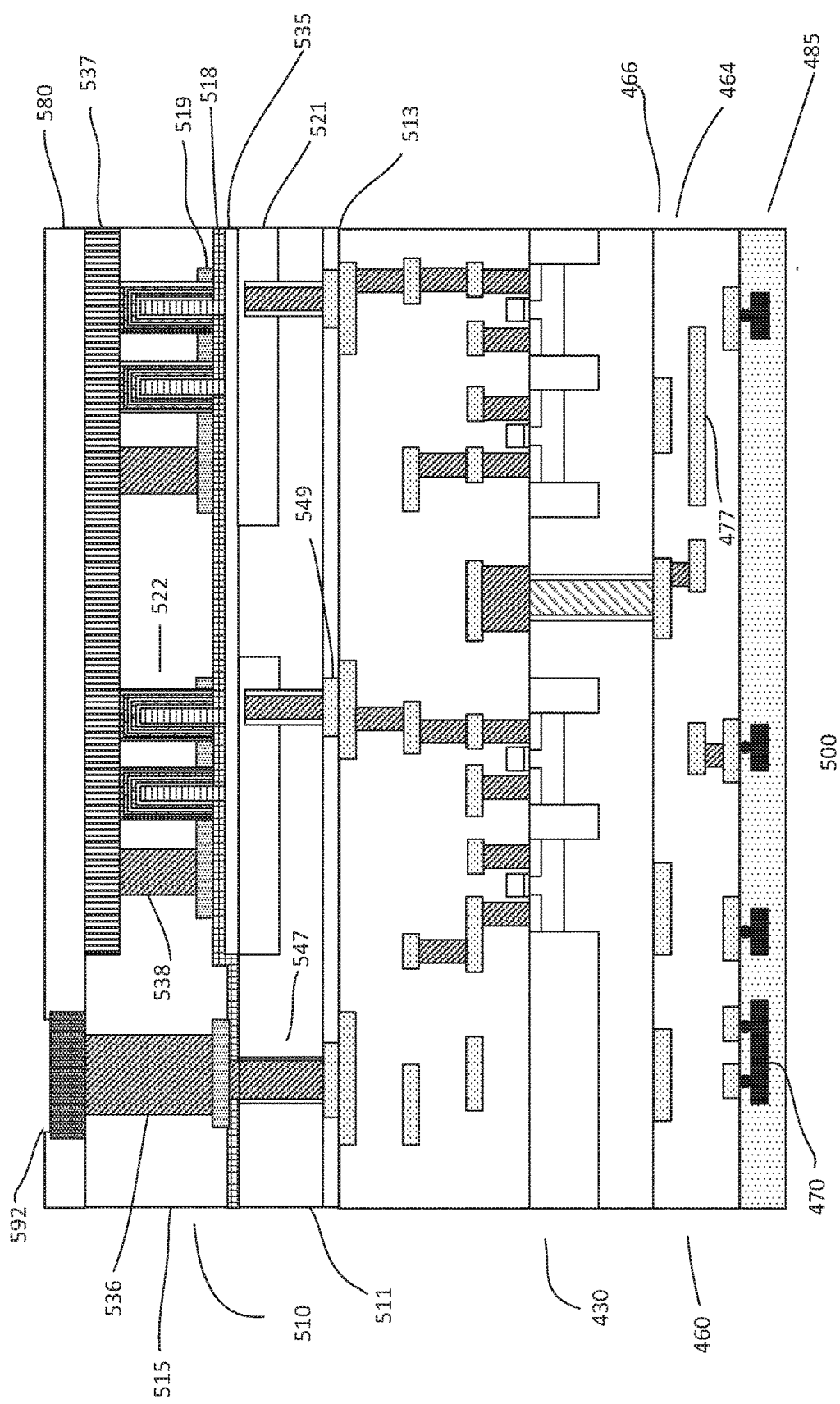

After forming the RDL, the SoC die pads are prepared with metal bumps, such as copper bumps. A plurality of SoC dies or chips 470 of the display system are provided. The SoC dies may be prepared with metal bumps, such as copper bumps. The dies are die bonded to the SoC chip pads with the bumps on the bottom RDL surface. After bonding the dies to the RDL, the carrier wafer is removed, as shown in FIG. 5F.

The process continues by performing a pad opening process to expose the bond pads. For example, the passivation layer is etched to form bond pad openings to expose the bond pads. After bond pad opening, the wafer stack is diced to singulate the individual system devices, each with an LED device fusion bonded to a BP device with RDL and SoC chips mounted to it. Wire bonding is performed. After wire bonding, the device may be encapsulated by a mold compound 485.

The present disclosure may be embodied in other specific forms without departing from the spirit or essential characteristics thereof. The foregoing embodiments, therefore, are to be considered in all respects illustrative rather than limiting the invention described herein. The scope of the disclosure is thus indicated by the appended claims, rather than by the foregoing description, and all changes that come within the meaning and range of equivalency of the claims are intended to be embraced therein.

The invention claimed is:

1. A display system comprising:
   a light emitting diode (LED) device, wherein the LED device comprises
      a plurality of LEDs having LED terminals, and
      an LED bonding surface comprising a dielectric layer with LED bonding surface contact pads coupled to diode terminals of the LEDs;
   a backplane (BP) device, the BP device comprises a BP substrate having top and bottom surfaces, wherein the top surface comprises
      complementary metal oxide semiconductor (CMOS) components,
      a back-end-of-line (BEOL) dielectric having a plurality interlevel dielectric (ILD) layers, wherein an ILD layer includes a contact level with contacts and a metal level with metal lines, the ILD layer provides interconnections for the CMOS components,
      a top level of the BEOL dielectric with BP bonding surface contact pads, wherein the BP bonding surface is bonded to the LED bonding surface, the LED bonding surface contact pads and the BP bonding surface contact pads provides interconnections between the BP and LED devices,
      a plurality of BP through silicon via (TSV) contacts disposed in the BP substrate, wherein the BP TSV contacts are interconnected to TSV contact regions on the BEOL dielectric, and
      a redistribution layer (RDL) having top and bottom RDL surfaces, the top RDL surface is disposed on the bottom surface of the BP substrate, wherein the redistribution layer provides interconnection to the BP TSV contacts and chip pads disposed on the bottom RDL surface; and
   a plurality of system on chip (SoC) chips bonded to the chip pads on the bottom RDL surface, wherein the SoC chips are electrically coupled to the CMOS components of the BP device and LEDs of the LED device.

2. The display system of claim 1 wherein the LEDs of the LED device comprise multi-quantum well (MQW) LEDs.

3. The display system of claim 1 wherein the SoC chips comprise chips of the display system which include CPU cores, DSP cores, on-chip memories, audio/video codes, eye/head tracking sensors, wireless interconnections, or a combination thereof.

4. A display system comprising:
   an LED device, wherein the LED device comprises an LED bonding surface with LED contact pads coupled to terminals of LEDs of the LED device;
   a backplane (BP) device, the BP device comprises a BP substrate having top and bottom surfaces, wherein the top surface comprises
      complementary metal oxide semiconductor (CMOS) components and a back-end-of-line (BEOL) dielectric with a plurality of interlevel dielectric (ILD) layers with interconnections, a top surface of the BEOL dielectric includes BEOL contact pads and serves as a BP bonding surface,
      wherein the BP bonding surface and LED bonding surface are bonded together to result in a common bonded surface for the bonded BP and LED devices, wherein the BEOL contacts and LED contacts are coupled to provide interconnections between the CMOS components of the BP device and LEDs of the LED device, and
      a plurality of BP through silicon via (TSV) contacts disposed in the BP substrate, wherein the BP TSV contacts are interconnected to TSV contact regions on the BEOL dielectric;
   a redistribution layer (RDL) having top and bottom RDL surfaces, the top RDL surface is disposed on the bottom surface of the BP substrate, wherein the redistribution layer provides interconnection to the BP TSV contacts and chip pads disposed on the bottom RDL surface; and
   a plurality of system on chip (SoC) chips bonded to the chip pads on the bottom RDL surface, wherein the SoC chips are electrically coupled to the CMOS components of the BP device and LEDs of the LED device.

5. The display system of claim 4 wherein the common bonded surface comprises a fusion bonded surface.

6. The display system of claim 4 wherein the SoC chips comprise chips of the display system.

7. The display system of claim 6 wherein the SoC chips comprise CPU cores, DSP cores, on-chip memories, audio/video codes, eye/head tracking sensors, wireless interconnections, or a combination thereof.

8. The display system of claim 4 wherein the LEDs of the LED device comprise multi-quantum well (MQW) LEDs.

9. The display system of claim 4 wherein the LED device is configured as an inverted LED device, the inverted LED device comprises:
   a dielectric layer covering the LEDs of the LED device, the dielectric layer serves as the bonding surface of the inverted LED device;
   each LED of the LED device comprises an LED base, wherein LED bases of the LEDs of the LED device serve as first LED terminals, the first LED terminals are commonly coupled to form a common first LED terminal of the LEDs; and each LED of the LED device includes a second terminal, wherein the second terminal is a non-common terminal of the LEDs of the LED device.

10. The display system of claim 9 wherein a transparent conductive electrode is disposed over the bases of the LEDs and serve as the common LED terminal.

11. The display system of claim 9 wherein:
a conductive base layer is disposed over the bases of the LEDs; and
a transparent conductive electrode is disposed on the conductive base layer, the transparent conductive electrode serves as the common LED terminal.

12. The display system of claim 9 wherein the LED contact pads are coupled to the common and non-common terminals of the LEDs.

13. The display system of claim 4 wherein the LED device is configured as a non-inverted LED device, the non-inverted LED device comprises:
an LED substrate on which LEDs of the LED device are disposed on a first major LED substrate surface;
LED wells in the substrate, the LED wells are coupled to first LED terminals of the LEDs;
first LED TSV contacts coupled to the LED wells, second LED TSV contacts for coupling to second LED terminals of the LEDs, wherein the second LED terminals of the LEDs are commonly coupled to serve as a common second LED terminal; and
a dielectric layer disposed on a second major LED substrate surface, the dielectric layer includes the LED contact pads coupled to the first and second LED TSV contacts, wherein the dielectric layer serves as the LED bonding surface.

14. The display system of claim 13 wherein a transparent conductive electrode is disposed over the LEDs and serve as the common second LED terminal.

15. The display system of claim 14 wherein the transparent conductive electrode contacts the second LED terminals of the LEDs.

16. A system comprising:
a light emitting diode (LED) device having a plurality of LEDs with LED terminals, the LED device includes a dielectric layer having a top surface which includes LED contact pads coupled to the LED terminal, the dielectric layer serves as an LED bonding surface;
a backplane (BP) device having with complementary metal oxide semiconductor (CMOS) components disposed on a first surface of a BP substrate, the BP device includes a back-end-of-line (BEOL) dielectric with interconnections, the BEOL dielectric includes a top surface with BP contact pads and serves as a BP bonding surface, a common bonded surface of the BP and LED devices resulting from bonding the BP and LED bonding surfaces, wherein the BP contact pads and LED contact pads are coupled to interconnect the CMOS components of the BP device to LEDs of the LED device;
a plurality of BP contacts disposed in the BP substrate, wherein the BP contacts are interconnected to contact regions on the BEOL dielectric; and
a redistribution layer (RDL) having top and bottom RDL surfaces, the top RDL surface is disposed on a second surface of the BP substrate, wherein the RDL interconnects the BP contacts and chip pads disposed on the bottom RDL surface.

17. The system of claim 16 comprises a plurality of system on chip (SoC) chips bonded to the chip pads on the bottom RDL surface, wherein the SoC chips are electrically coupled to the CMOS components of the BP device and LEDs of the LED device.

18. The system of claim 16 wherein the LEDs of the LED device comprise multi-quantum well (MQW) LEDs.

19. The system of claim 16 wherein the LED device is configured as a non-inverted LED device, the non-inverted LED device comprises:
an LED substrate on which LEDs of the LED device are disposed on a first major LED substrate surface;
LED wells in the substrate, the LED wells are coupled to first LED terminals of the LEDs;
first LED contacts coupled to the LED wells, second LED contacts for coupling to second LED terminals of the LEDs, wherein the second LED terminals of the LEDs are commonly coupled to serve as a common second LED terminal; and
a dielectric layer disposed on a second major LED substrate surface, the dielectric layer includes the LED contact pads coupled to the first and second LED contacts, wherein the dielectric layer serves as the LED bonding surface.

20. The system of claim 16 wherein the LED device is configured as an inverted LED device, the inverted LED device comprises:
a dielectric layer covering the LEDs of the LED device, the dielectric layer serves as the bonding surface of the inverted LED device;
each LED of the LED device comprises an LED base, wherein LED bases of the LEDs of the LED device serve as first LED terminals, the first LED terminals are commonly coupled to form a common first LED terminal of the LEDs; and
each LED of the LED device includes a second terminal, wherein the second terminal is a non-common terminal of the LEDs of the LED device.

* * * * *

UNITED STATES PATENT AND TRADEMARK OFFICE
CERTIFICATE OF CORRECTION

PATENT NO. : 10,037,981 B2
APPLICATION NO. : 15/599465
DATED : July 31, 2018
INVENTOR(S) : Srinivasa Banna et al.

Page 1 of 1

It is certified that error appears in the above-identified patent and that said Letters Patent is hereby corrected as shown below:

In the Specification

Column 2
Line 4, replace "LEI)" with -- LED --.

Column 3
Line 10, replace "FIGS. 1A-D)" with -- FIGS. 1A-D --.

Column 5
Line 65, replace "The base may be medium doped" with -- The base may be a medium doped --.

Column 6
Line 2, replace "in situ" with -- insitu --.

Column 6
Line 44, replace "in situ" with -- insitu --.

Column 6
Line 57, replace "215" with -- 218 --.

Column 7
Line 50, replace "the percentage of in" with -- the percentage of In --.

Column 9
Line 13, replace "LEI)" with -- LED --.

Column 10
Line 36, replace "a (S/D) region" with -- a S/D region --.

Signed and Sealed this
Twenty-fifth Day of September, 2018

Andrei Iancu
*Director of the United States Patent and Trademark Office*